United States Patent
Ogawa et al.

(10) Patent No.: US 9,653,351 B2
(45) Date of Patent: May 16, 2017

(54) METHOD OF MANUFACTURING SEMICONDUCTOR DEVICE

(71) Applicant: HITACHI KOKUSAI ELECTRIC INC., Tokyo (JP)

(72) Inventors: Arito Ogawa, Toyama (JP); Atsuro Seino, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/273,067

(22) Filed: Sep. 22, 2016

(65) Prior Publication Data

US 2017/0011958 A1 Jan. 12, 2017

Related U.S. Application Data

(63) Continuation of application No. PCT/JP2014/059245, filed on Mar. 28, 2014.

(51) Int. Cl.
| | |
|---|---|
| H01L 21/4763 | (2006.01) |
| H01L 21/44 | (2006.01) |
| H01L 21/768 | (2006.01) |
| H01L 21/285 | (2006.01) |
| C23C 16/34 | (2006.01) |
| C23C 16/14 | (2006.01) |
| C23C 16/455 | (2006.01) |

(52) U.S. Cl.
CPC ........ *H01L 21/76876* (2013.01); *C23C 16/14* (2013.01); *C23C 16/34* (2013.01); *C23C 16/45529* (2013.01); *H01L 21/28556* (2013.01); *H01L 21/76877* (2013.01)

(58) Field of Classification Search
CPC ......... H01L 21/02266; H01L 21/02271; H01L 21/02505; H01L 21/28506; H01L 21/3145; H01L 21/31604; H01L 21/31683; H01L 21/32051
USPC ........ 438/625, 629, 648, 652, 656, 680, 685
See application file for complete search history.

(56) References Cited

U.S. PATENT DOCUMENTS

2011/0221063 A1* 9/2011 Ichinose ........... H01L 21/76898
257/751

* cited by examiner

*Primary Examiner* — Hsien Ming Lee
(74) *Attorney, Agent, or Firm* — Volpe and Koenig, P.C.

(57) ABSTRACT

A method of manufacturing a semiconductor device may include: (a) loading a substrate into a process chamber, the substrate having: a process surface provided with a first metal film containing at least a first metal element; (b) forming a second metal film on the substrate loaded in the process chamber by alternately supplying a metal compound and a first reactive gas reactive with the metal compound to the substrate a plurality of times; (c) alternately performing steps (c-1) and (c-2) a plurality of times wherein the step (c-1) includes: forming an amorphous third metal film on the second metal film, and the step (c-2) includes: forming a fourth metal film on the third metal film; and (d) forming an amorphous fifth metal film on the fourth metal film by supplying the metal compound mixed with the second reactive gas to the substrate.

6 Claims, 15 Drawing Sheets

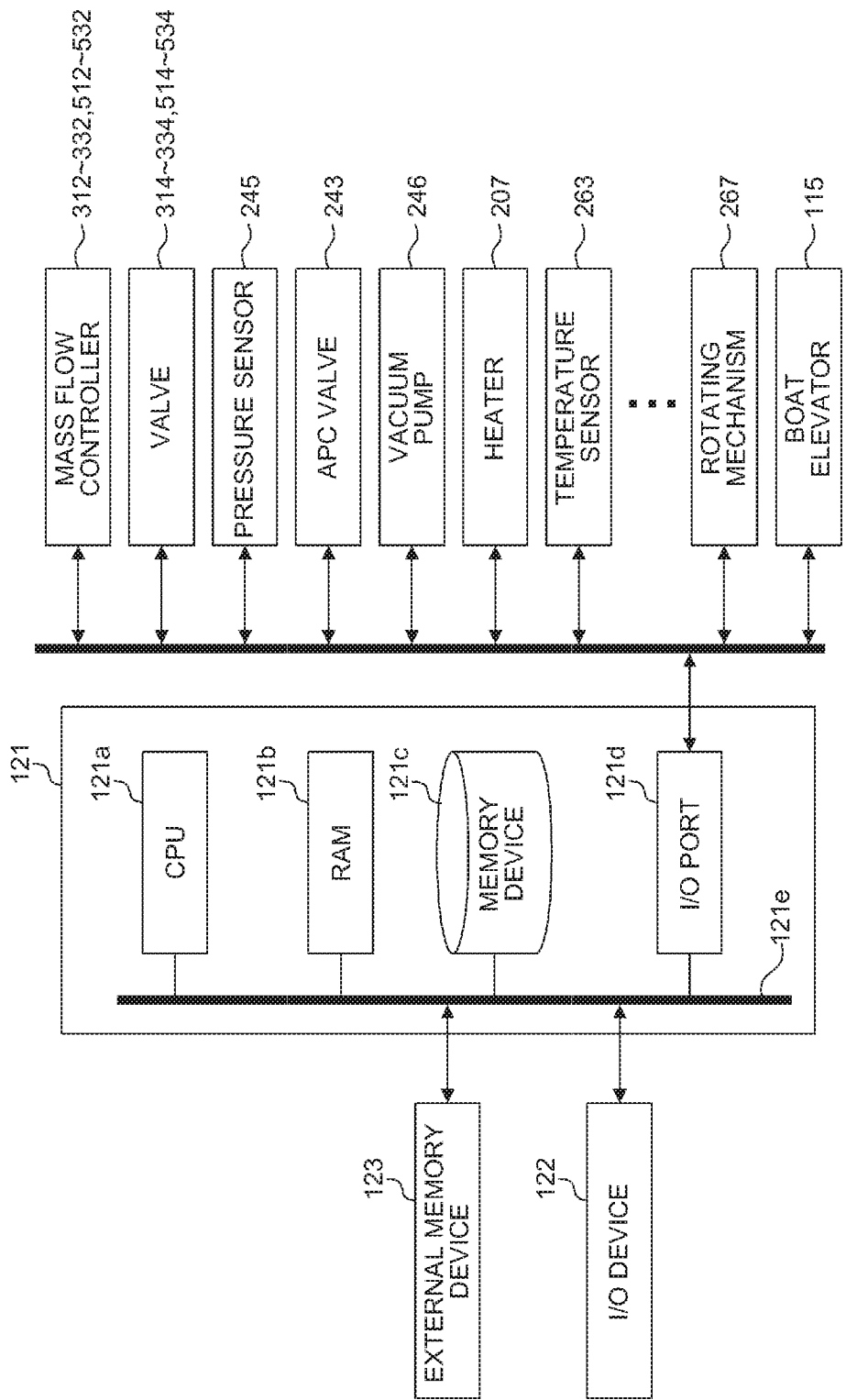

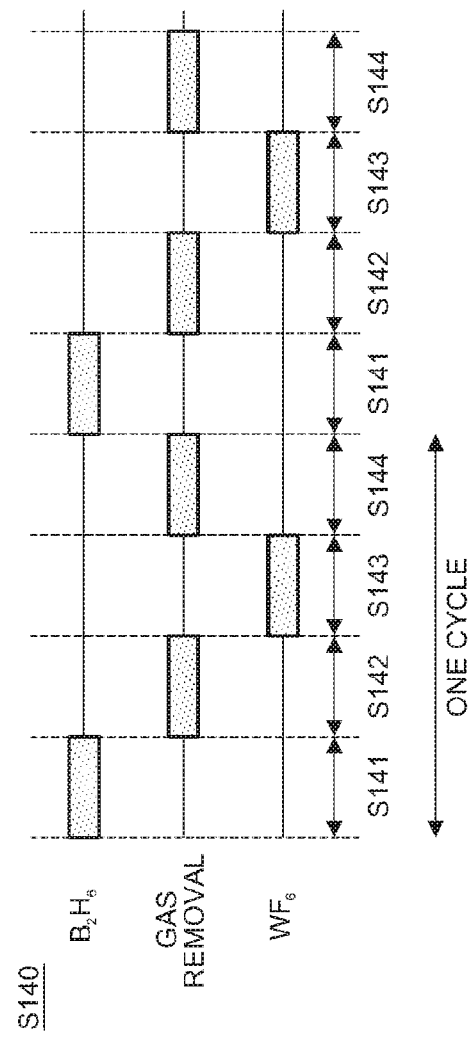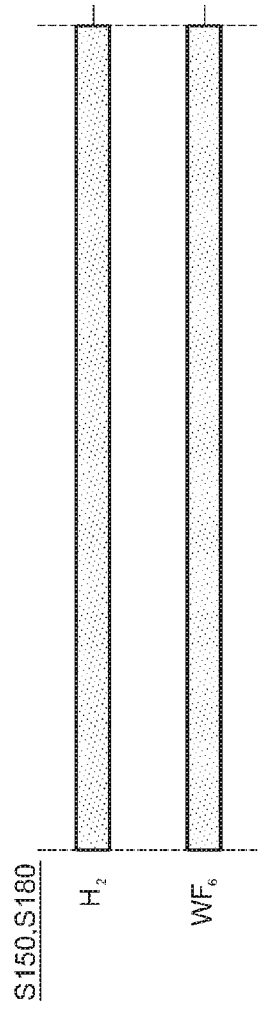

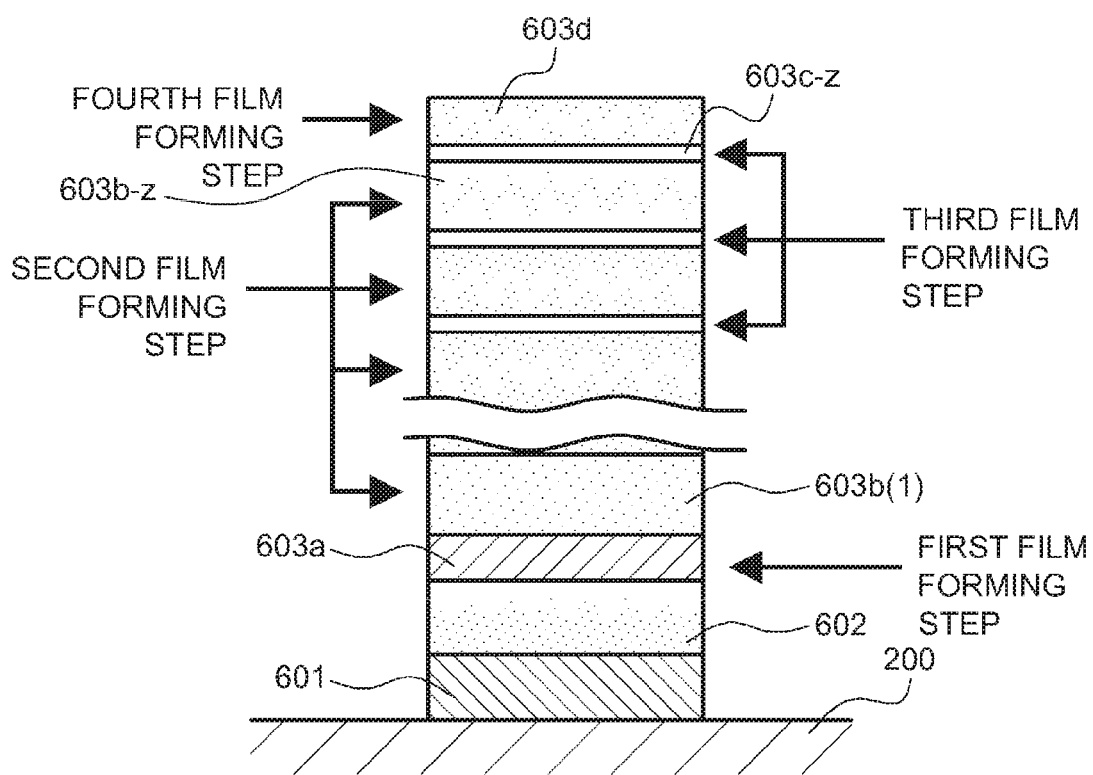

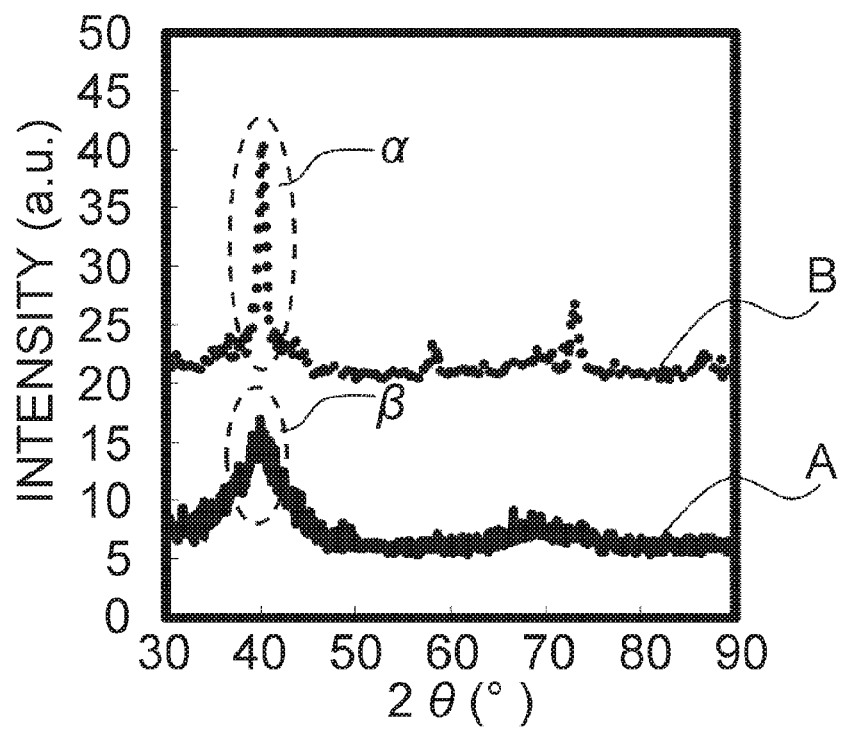

METHOD OF MANUFACTURING SEMICONDUCTOR DEVICE

CROSS-REFERENCE TO RELATED PATENT APPLICATION

This non-provisional U.S. patent application claims priority under 35 U.S.C. §119 of International Patent Application No. PCT/JP2014/059245, filed on Mar. 28, 2014, in the WIPO, the entire contents of which are hereby incorporated by reference.

BACKGROUND

1. Field

The present disclosure relates to a method of manufacturing a semiconductor device, and more particularly, to a method of manufacturing a semiconductor device, which includes a step of forming a metal film on a substrate (wafer).

2. Description of the Related Art

Recently, with the improvement in integration degree and performance of a circuit, a metal film is required to be formed in an ultra-fine groove having a narrower opening than in the related art. The metal film is used as components such as a control electrode of a flash memory and a contact plug of LSI (Large Scale Integration). When the metal film is used as a component such as the control electrode, a low-resistance film is required. For example, a film containing low-resistance tungsten is used as a component such as the control electrode.

When a film is formed at high temperature, the resistance value of the film increases. Thus, the film (tungsten-containing film) may be preferably formed at low temperature. However, since the tungsten-containing film formed at low temperature has stress that rises with thermal expansion, the tungsten-containing film is known to easily peel off. When the peeling film adheres to the substrate, the peeling film may have adverse effects on the yield, wafer characteristics and the like.

SUMMARY

Described herein is a technique capable of suppressing a peel-off of a film when a low-resistance film is formed.

According to one aspect described herein, a method of manufacturing a semiconductor device may include: (a) loading a substrate into a process chamber, the substrate having: a process surface provided with a first metal film containing at least a first metal element; and surfaces without the first metal film; (b) forming a second metal film on the substrate loaded in the process chamber by alternately supplying a metal compound and a first reactive gas reactive with the metal compound to the substrate a plurality of times, wherein the metal compound contains at least a second metal element different from the first metal element; (c) alternately performing steps (c-1) and (c-2) a plurality of times wherein the step (c-1) includes: forming an amorphous third metal film on the second metal film by supplying the metal compound mixed with a second reactive gas reactive with the metal compound to the substrate, and the step (c-2) includes: forming a fourth metal film on the third metal film by alternately supplying the metal compound and the first reactive gas to the substrate at least once; and (d) forming an amorphous fifth metal film on the fourth metal film by supplying the metal compound mixed with the second reactive gas to the substrate.

BRIEF DESCRIPTION OF THE DRAWINGS

FIG. 5 is a block diagram schematically illustrating a controller included in the substrate processing apparatus 101 of FIG. 1.

FIG. 10 is a diagram illustrating a sequence for forming a tungsten film at a first film forming step according to the first embodiment described herein.

FIG. 11 is a diagram illustrating a sequence for forming a tungsten film at second and fourth film forming steps according to the first embodiment described herein.

FIGS. 13A through 13F are diagrams illustrating the state of the wafer in the sequence for forming the tungsten film according to the first embodiment described herein.

FIG. 14 is a graph illustrating a result obtained by analyzing the crystal structure of the tungsten film which is formed according to the first embodiment described herein.

FIG. 15 is a table showing the stress of the film according to the first embodiment described herein and the stress of a film according to a comparative example.

DETAILED DESCRIPTION OF THE PREFERRED EMBODIMENTS

Hereafter, preferred embodiments will be described with reference to the accompanying drawings. A substrate processing apparatus which is preferably used in a first embodiment described herein is one example of a semiconductor manufacturing apparatus used in a process of manufacturing a semiconductor device such as IC (Integrated Circuit). In the following descriptions, a vertical apparatus which performs a process such as a process of forming a film on a substrate will be exemplified as the substrate processing apparatus. However, the technique described herein is not based on the supposition that the vertical apparatus is used. The technique described herein may be applied even when a single-wafer type substrate processing apparatus is used.

<Entire Configuration of Substrate Processing Apparatus>

Figure 1:
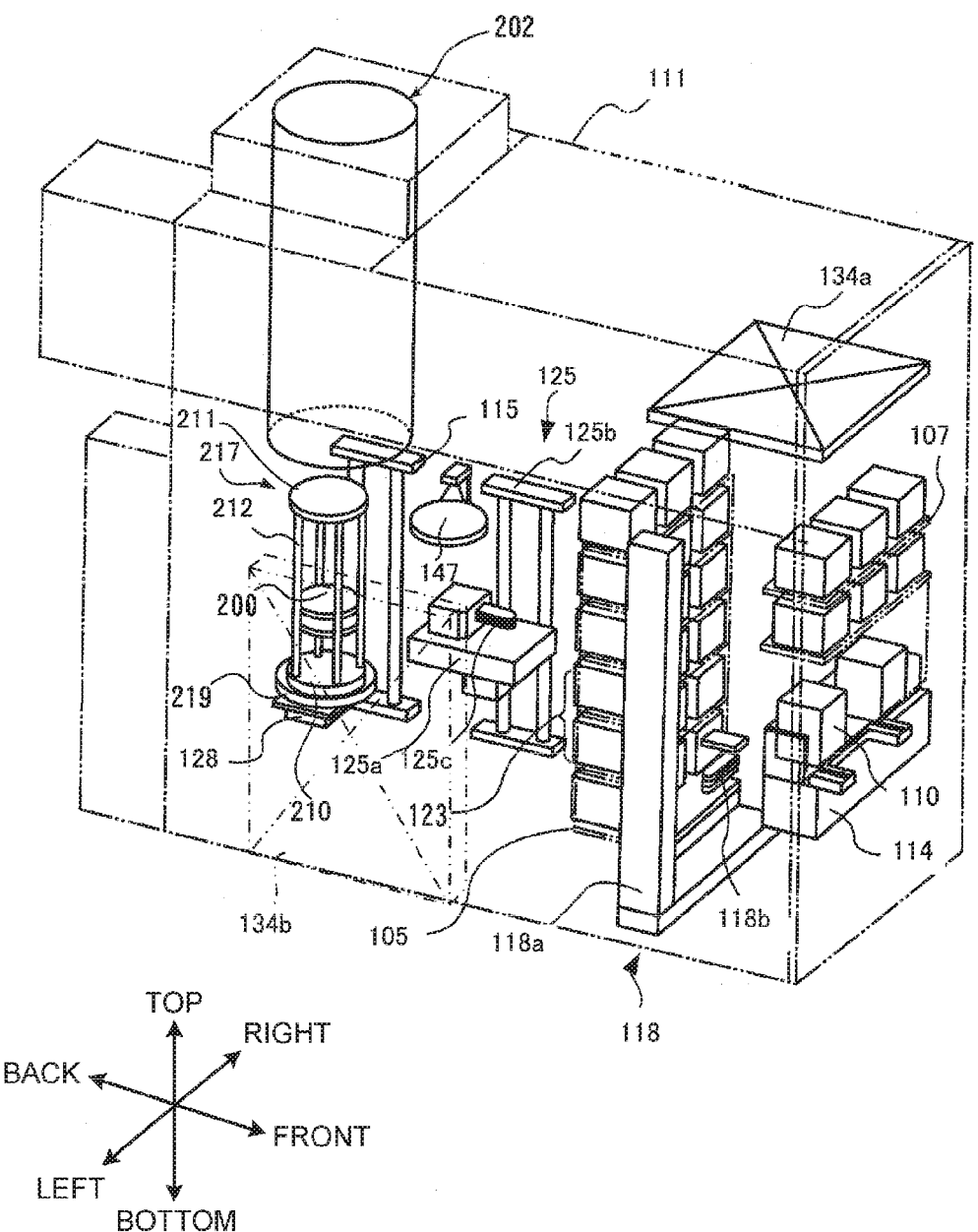
FIG. 1 is a diagram schematically illustrating a substrate processing apparatus which is preferably used in a first embodiment described herein.

As illustrated in FIG. 1, a cassette 110 storing a wafer 200 as an example of a substrate is used in the substrate processing apparatus 101. The wafer 200 is constituted by a material such as silicon. The substrate processing apparatus 101 includes a housing 111. A cassette stage 114 is installed in the housing 111. The cassette 110 is loaded onto the cassette stage 114 or unloaded from the cassette stage 114 by an in-step transfer apparatus (not illustrated).

The cassette 110 may be placed on the cassette stage 114 by the in-step transfer apparatus such that a wafer entry/exit port (not illustrated) of the cassette 110 faces upward while the wafer 200 in the cassette 110 is vertically positioned. The cassette stage 114 is configured to rotate the cassette 110 by 90° toward the back of the housing 111, such that the wafer entry/exit port of the cassette 110 faces the back of the housing 111 while the wafer 200 in the cassette 110 is horizontally positioned.

A cassette shelf 105 is installed in substantially the center of the housing 111 in the forward and backward direction. A plurality of cassettes 110 may be stored in a plurality of rows and columns in the cassette shelf 105. A transfer shelf 123 in which a cassette 110 transferred by a wafer transfer mechanism 125 is stored is installed at the cassette shelf 105.

A spare cassette shelf 107 is installed above the cassette stage 114, and configured to store spare cassettes 110.

A cassette transfer apparatus 118 is installed between the cassette stage 114 and the cassette shelf 105. The cassette transfer apparatus 118 is constituted by a cassette elevator 118a and a cassette transfer mechanism 118b. The cassette elevator 118a can move up and down a cassette 110 while supporting the cassette 110, and the cassette transfer mechanism 118b serves as a transfer mechanism. The cassette transfer apparatus 118 is configured to transfer a cassette 110 between the cassette stage 114 and the cassette shelf 105 and between the cassette stage 114 and the spare cassette shelf 107, through consecutive operations of the cassette elevator 118a and the cassette transfer mechanism 118b.

The wafer transfer mechanism 125 is installed at the back of the cassette shelf 105. The wafer transfer mechanism 125 is constituted by a wafer transfer unit 125a and a wafer transfer unit elevator 125b. The wafer transfer unit 125a can horizontally rotate or linearly move the wafer 200, and the wafer transfer unit elevator 125b can move up and down the wafer transfer unit 125a. A tweezer 125c for picking up a wafer 200 is installed on the wafer transfer unit 125a. The wafer transfer mechanism 125 is configured to load (charge) a wafer 200 into a boat 217 or unload (discharge) a wafer 200 out of the boat 217 while the wafer 200 is placed by the tweezer 125c, through consecutive operations of the wafer transfer unit 125a and the wafer transfer unit elevator 125b.

A process furnace 202 for thermally processing a wafer 200 is installed at the top of the rear portion of the housing 111. A furnace opening shutter 147 is configured to open/close the lower end of the process furnace 202.

The boat elevator 115 which moves up and down the boat 217 is installed under the process furnace 202. An arm 128 is connected to an elevator board of the boat elevator 115. A seal cap 219 is horizontally installed on the arm 128. The seal cap 219 is configured to seal the lower end of the process furnace 202 while vertically supporting the boat 217.

The boat 217 includes a plurality of support members (not illustrated), and is configured to support a plurality of wafers 200 (for example, 50 to 150 sheets) which are vertically arranged while the centers thereof are aligned with each other.

A clean unit 134a for supplying clean air as a cleaned atmosphere is installed above the cassette shelf 105. The clean unit 134a is constituted by a fan (not illustrated) and a dust filter (not illustrated), and configured to supply clean air into the housing 111.

Another clean unit 134b for supplying clean air is installed at an end portion of the left side of the housing 111. The clean unit 134b is also constituted by a fan (not illustrated) and a dust filter (not illustrated), and configured to supply clean air to around the components such as the wafer transfer unit 125a and the boat 217. After being supplied to around the components such as the wafer transfer unit 125a and the boat 217, the clean air is exhausted to the outside of the housing 111.

<Operation of Substrate Processing Apparatus>

Next, main operations of the substrate processing apparatus 101 will be described.

The in-step transfer apparatus (not illustrated) places the cassette 110 on the cassette stage 114. The cassette 110 is placed on the cassette stage 114, such that the wafer entry/exit of the cassette 110 faces upward while the wafer 200 in the cassette 110 is vertically positioned. Then, the cassette 110 is rotated 90° toward the back of the housing 111 by the cassette stage 114, such that the wafer entry/exit port of the cassette 110 faces the back of the housing 111 while the wafer 200 in the cassette 110 is horizontally positioned.

Then, the cassette 110 is automatically transferred and placed onto a designated shelf between the cassette shelf 105 and the spare cassette shelf 107 by the cassette transfer apparatus 118, temporarily stored in the designated shelf, and transferred to the transfer shelf 123 from the cassette shelf 105 or the spare cassette shelf 107 by the cassette transfer apparatus 118. The cassette 110 may be directly transferred to the transfer shelf 123 from the cassette stage 114 by the cassette transfer apparatus 118.

When the cassette 110 is transferred to the transfer shelf 123, the wafer 200 is picked up from the cassette 110 through the wafer entry/exit port by the tweezer 125c of the wafer transfer unit 125a, and loaded (charged) into the boat 217. The wafer transfer unit 125a which loaded the wafer 200 into the boat 217 returns to the cassette 110, and loads the next wafer 200 into the boat 217.

When a predetermined number of wafers 200 are loaded in the boat 217, the furnace opening shutter 147 which has closed the lower end portion of the process furnace 202 is opened in order to open the lower end portion of the process furnace 202. Then, the boat 217 housing the plurality of wafers 200 therein is loaded into the process furnace 202 through a lifting operation of the boat elevator 115, and the lower end portion of the process furnace 202 is sealed by the seal cap 219.

After the boat 217 is loaded, a predetermined process for the wafers 200 is performed in the process furnace 202. After the process is performed, the wafers 200 and the cassette 110 are unloaded to the outside of the housing 111 in the opposite order of the above-described order.

<Configuration of Process Furnace>

Figure 2:
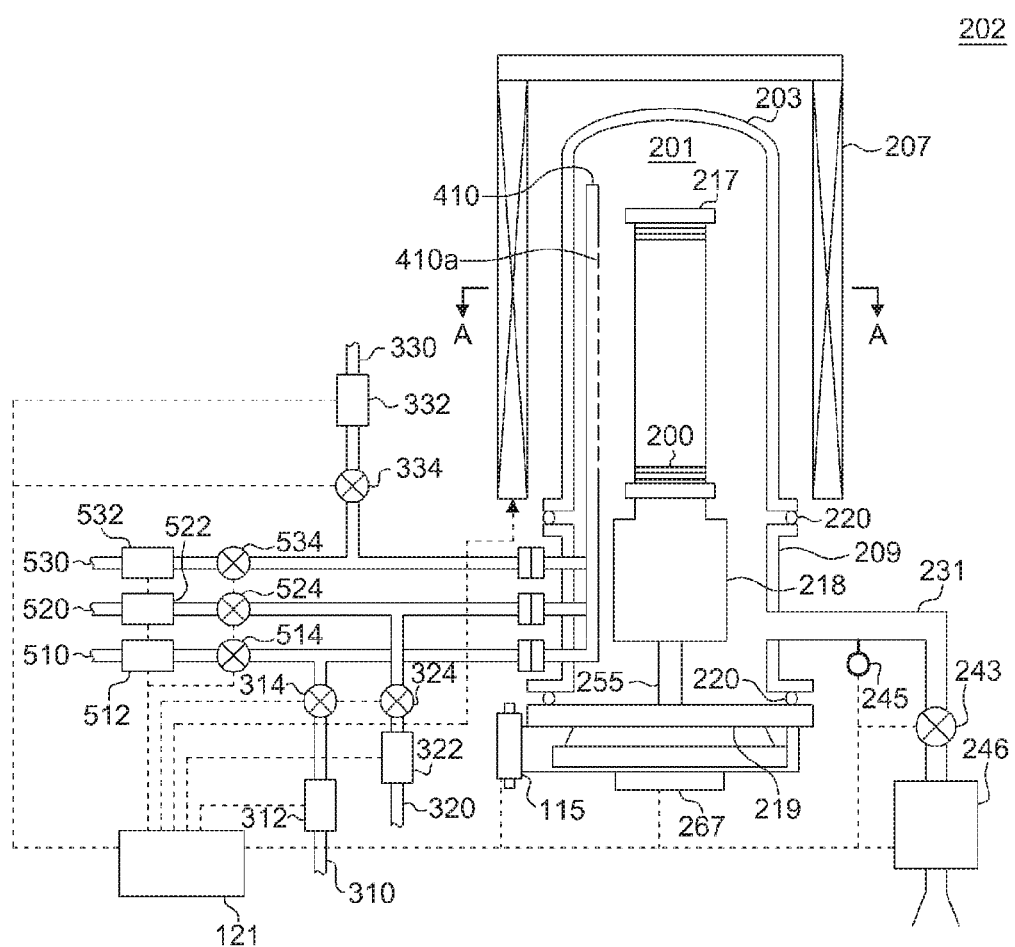
FIG. 2 is a diagram schematically illustrating a process furnace used in the first embodiment described herein and members associated with the process furnace, showing a longitudinal cross-section of the process furnace.
Figure 3:
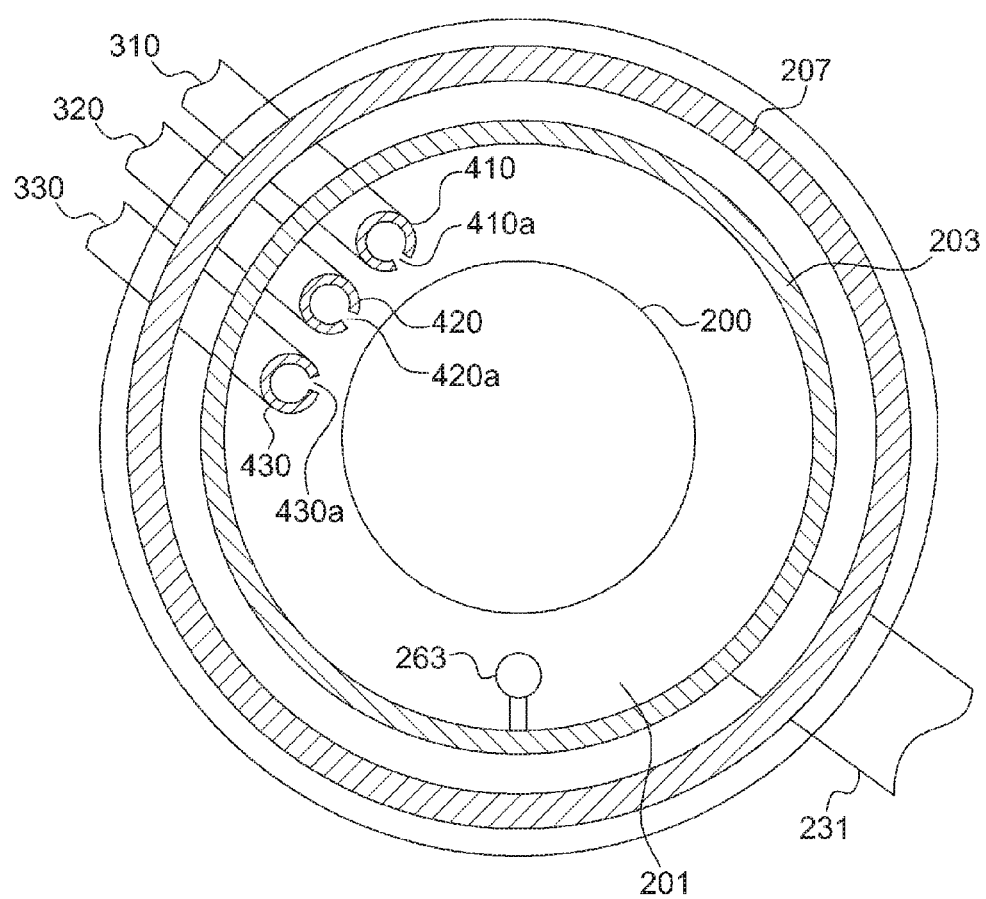
FIG. 3 is a cross-sectional view of the process furnace of FIG. 2, taken along the line A-A.

As illustrated in FIGS. 2 and 3, a heater 207 is installed in the process furnace 202, the heater 207 serving as a heating unit (heating mechanism and heating system) for heating a wafer 200 which is a substrate. The heater 207 includes an insulation member (not illustrated) and a plurality of heater strands (not illustrated). The insulation member is cylindrical with a closed upper end. The heater 207 has a unit configuration in which the heater strands are installed across the insulation member. A reaction tube 203 constituting a reaction container (process container) is installed in the heater 207 so as to be concentric with the heater 207. The reaction tube 203 is formed of a heat-resisting material such as quartz ($SiO_2$) and silicon carbide (SiC), and cylindrical with a closed upper end and an open lower end.

A manifold 209 formed of a material such as stainless steel is installed at the lower end of the reaction tube 203 with an O-ring 220 interposed therebetween, the O-ring 220 serving as a sealing member. The lower end of the reaction tube 203 has an opening which is airtightly sealed by the seal cap 219 serving as a lid, with the O-ring 220 interposed therebetween. A process chamber 201 is defined by at least the reaction tube 203, the manifold 209 and the seal cap 219. The boat 217 serving as a substrate retaining unit (substrate retainer or substrate retaining member) is vertically installed on the seal cap 219 with a boat support 218 interposed therebetween. The boat support 218 is a support body which retains the boat 217 while supporting the boat 217.

Figure 4:
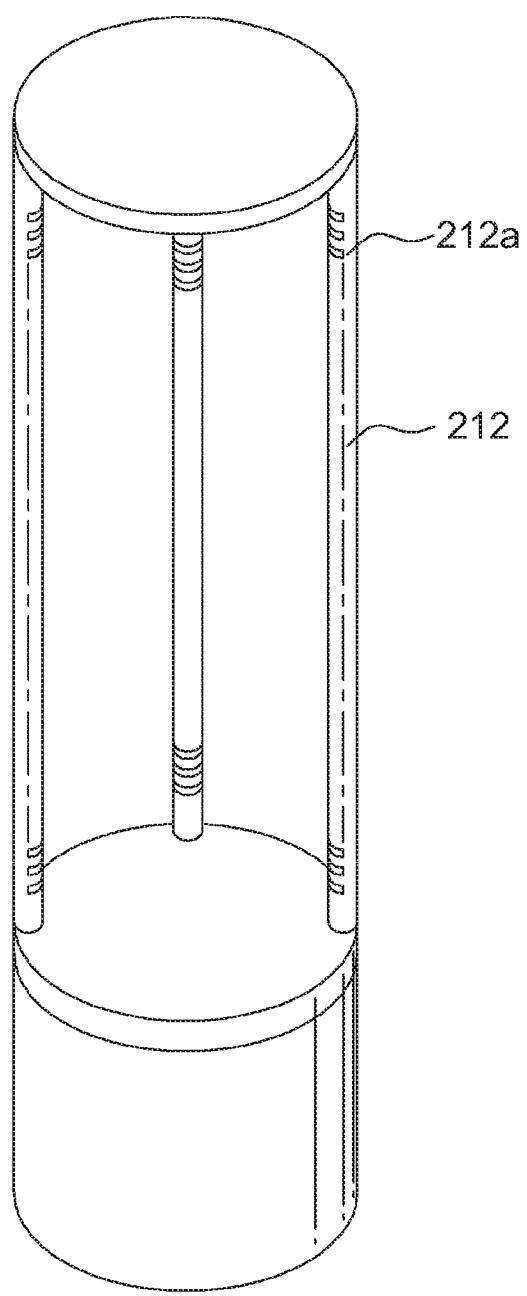
FIG. 4 is a diagram exemplifying a substrate support included in the substrate processing apparatus 101 of FIG. 1.

As illustrated in FIG. 4, the boat 217 includes boat pillars 212. The boat pillars 212 have grooves 212a formed therein. A plurality of wafers 200 which are batch-processed are inserted into the respective grooves 212a. The wafers 200 horizontally positioned in the respective grooves 212a are vertically stacked in a multilayer structure. The boat 217 may be moved up into the reaction tube 203 or moved down out of the reaction tube 203 by the boat elevator 115 serving as a transfer unit (transfer mechanism). In order to improve the uniformity of wafer processing, the boat rotating mechanism 267 for rotating the boat 217 is installed at the lower end portion of the boat support 218. The boat rotating mechanism 267 may be driven to rotate the boat 217 supported by the boat support 218. The heater 207 heats the wafers 200 inserted into the process chamber 201 to a predetermined temperature.

A nozzle 410 (first nozzle 410), a nozzle 420 (second nozzle 420) and a nozzle 430 (third nozzle 430) are installed in the process chamber 201 so as to penetrate the manifold 209. A gas supply pipe 310 (first gas supply pipe 310), a gas supply pipe 320 (second gas supply pipe 320) and a gas supply pipe 330 (third gas supply pipe 330), which are gas supply lines, are connected to the nozzle 410, the nozzle 420 and the nozzle 430, respectively. The three nozzles 410 to 430 and the three gas supply pipes 310 to 330, which are installed in the reaction tube 203, are configured to supply a plurality of process gases into the process chamber 201. In the example illustrated in FIG. 2, three kinds of gases (process gases) are supplied into the process chamber 201.

A gas supply source (not illustrated), an MFC (Mass Flow Controller) 312 serving as a flow rate controller, and a valve 314 serving as an opening/closing valve are sequentially installed at the gas supply pipe 310 from the upstream side toward the downstream side of the gas supply pipe 310. The nozzle 410 is connected to the front end portion of the gas supply pipe 310. The nozzle 410 is an L-shaped long nozzle, and includes a horizontal portion installed through the sidewall of the manifold 209 and a vertical portion in an annular space disposed between the inner wall of the reaction tube 203 and the wafer 200. The vertical portion of the nozzle 410 is vertically installed from the lower portion toward the upper portion of the reaction tube 203 along the inner wall of the reaction tube 203 (along the stacking direction of the wafers 200). That is, the vertical portion of the nozzle 410 is vertically installed from one end toward the other end of a wafer arrangement region. In other words, the nozzle 410 is vertically installed in a region which is disposed at the side of the wafer arrangement region having the wafers 200 arranged therein and horizontally surrounds the wafer arrangement region, along the wafer arrangement region.

Gas supply holes 410a for supplying a gas are disposed at the side surface of the nozzle 410. The gas supply holes 410a are open toward the center of the reaction tube 203. The gas supply holes 410a are installed across the nozzle 410 from the upper portion to the lower portion of the reaction tube 203. The opening areas of the gas supply holes 410a may be equal to each other or increase or decrease from the lower portion toward the upper portion of the reaction tube 203. The gas supply holes 410a are disposed at the same pitches. A first gas supply system is constituted mainly by the gas supply pipe 310, the MFC 312, the valve 314 and the nozzle 410.

A carrier gas supply pipe 510 for supplying a carrier gas is connected to the gas supply pipe 310. A gas supply source (not illustrated), an MFC 512 and a valve 514 are installed at the carrier gas supply pipe 510. A first carrier gas supply system is constituted by the carrier gas supply pipe 510, the MFC 512 and the valve 514. The first gas supply system may include the first carrier gas supply system.

A gas supply source (not illustrated), an MFC 322 serving as a flow rate controller, and a valve 324 serving as an opening/closing valve are sequentially installed at the gas supply pipe 320 from the upstream side toward the downstream side of the gas supply pipe 320. The nozzle 420 is connected to the front end portion of the gas supply pipe 320. The nozzle 420 is an L-shaped long nozzle, and includes a horizontal portion installed through the sidewall of the manifold 209 and a vertical portion installed in an annular space disposed between the inner wall of the reaction tube 203 and the wafer 200. The vertical portion of the nozzle 420 is vertically installed from the lower portion toward the upper portion of the reaction tube 203 along the inner wall of the reaction tube 203 (along the stacking direction of the wafers 200). That is, the vertical portion of the nozzle 410 is vertically installed from one end toward the other end of the wafer arrangement region. In other words, the nozzle 420 is vertically installed in a region which is disposed the side of the wafer arrangement region having the wafers 200 arranged therein and horizontally surrounds the wafer arrangement region, along the wafer arrangement region.

Gas supply holes 420a for supplying a gas are disposed at the side surface of the nozzle 420. The gas supply holes 420a are open toward the center of the reaction tube 203. The gas supply holes 420a are installed across the nozzle 420 from the lower portion to the upper portion of the reaction tube 203. The opening areas of the gas supply holes 420a may be equal to each other or increase or decrease from the lower portion toward the upper portion of the reaction tube 203. The gas supply holes 420a are disposed at the same pitches. A second gas supply system is constituted mainly by the gas supply pipe 320, the MFC 322, the valve 324 and the nozzle 420.

A carrier gas supply pipe 520 for supplying a carrier gas is connected to the gas supply pipe 320. A gas supply source (not illustrated), an MFC 522 and a valve 524 are sequentially installed at the carrier gas supply pipe 520 from the upstream side toward the downstream side of the carrier gas supply pipe 520. A second carrier gas supply system is constituted by the carrier gas supply pipe 520, the MFC 522 and the valve 524. The second gas supply system may include the second carrier gas supply system.

A gas supply source (not illustrated), an MFC 332 serving as a flow rate controller and a valve 334 serving as an opening/closing valve are sequentially installed at the gas supply pipe 330 from the upstream side toward the downstream side of the gas supply pipe 330. The nozzle 430 is connected to the front end portion of the gas supply pipe 330. The nozzle 430 is an L-shaped long nozzle, and includes a horizontal portion installed through the sidewall of the manifold 209 and a vertical portion installed in an annular space disposed between the inner wall of the reaction tube 203 and the wafer 200. The vertical portion of the nozzle 420 is vertically installed from the lower portion toward the upper portion of the reaction tube 203 along the inner wall of the reaction tube 203 (along the stacking direction of the wafers 200). That is, the vertical portion of the nozzle 410 is vertically installed from one end toward the other end of the wafer arrangement region. In other words, the nozzle 430 is vertically installed in a region which is disposed at the side of the wafer arrangement region having the wafers 200 arranged therein and horizontally surrounds the wafer arrangement region, along the wafer arrangement region.

Gas supply holes 430a for supplying a gas are disposed at the side surface of the nozzle 430. The gas supply holes 430a are open toward the center of the reaction tube 203. The gas supply holes 430a are installed across the nozzle 430 from the lower portion to the upper portion of the reaction tube 203. The opening areas of the gas supply holes 430a may be equal to each other or increase or decrease from the lower portion toward the upper portion of the reaction tube 203. The gas supply holes 430a are disposed at the same pitches. A third gas supply system is constituted by the gas supply pipe 330, the MFC 332, the valve 334 and the nozzle 430.

A carrier gas supply pipe 530 for supplying a carrier gas is connected to the gas supply pipe 330. A gas supply source (not illustrated), an MFC 532 and a valve 534 are sequentially installed at the carrier gas supply pipe 530 from the upstream side toward the downstream side of the carrier gas supply pipe 530. A third carrier gas supply system is constituted by the carrier gas supply pipe 530, the MFC 532 and the valve 534. The third gas supply system may include the third carrier gas supply system.

According to the gas supply method of the first embodiment, gases are supplied through the nozzles 410, 420 and 430 which are arranged in an annular cylindrical space defined by the inner wall of the reaction tube 230 and the end portions of the stacked wafers 200, and then initially jetted around the wafers 200 in the reaction tube 203 through the gas supply holes 410a, 420b and 430c installed at the respective nozzles 410, 420 and 430. In the reaction tube 203, the gases mainly flow in a direction parallel to the surface of the wafer 200, that is, a horizontal direction. Thus, the gases can be uniformly supplied onto the respective wafers 200, and the thicknesses of thin films formed on the respective wafers 200 can be uniformized. A gas remaining after reaction, that is, a residual gas flows toward an exhaust port, that is, an exhaust pipe 231 described later. However, the flow direction of the residual gas is properly specified according to the position of the exhaust port, and not limited to the vertical direction.

As an example of the above-described configuration, a source gas is supplied as a first process gas containing a first element. The source gas may include at least a metal containing gas (metal compound), for example, tungsten hexafluoride ($WF_6$) which is a tungsten-containing source. $WF_6$ is supplied into the process chamber 201 through the MFC 312 and the valve 314 which are installed at the gas supply pipe 310 and the nozzle 410.

A first reactive gas is supplied as a second process gas containing a second element. The first reactive gas may include at least a hydrogen-containing gas (hydrogen source), for example, diborane ($B_2H_6$). $B_2H_6$ is supplied into the process chamber 201 through the MFC 322 and the valve 324 which are installed at the gas supply pipe 320 and the nozzle 420.

A second reactive gas is supplied as a third process gas containing the second element. The second reactive gas includes a hydrogen-containing gas (hydrogen source), for example, $H_2$. $H_2$ is supplied into the process chamber 201 through the MFC 332 and the valve 334 which are installed at the gas supply pipe 330 and the nozzle 430.

For example, nitrogen ($N_2$) gas is supplied into the process chamber 201 through the MFCs 512 to 532, the valves 514 to 534, the gas supply pipes 510 to 530 and the nozzles 410 to 430, which are installed at the carrier gas supply pipes 510 to 530, respectively.

The exhaust pipe 231 for exhausting the atmosphere of the process chamber 201 is installed at the reaction tube 203. As illustrated in FIG. 3, the exhaust pipe 231 is installed at a side facing the gas supply holes 410a of the nozzle 410, the gas supply holes 420a of the nozzle 420 and the gas supply holes 430a of the nozzle 403 in the reaction tube 203, that is, at the opposite side of the gas supply holes 410a to 430a with the wafer 200 interposed therebetween, when seed from the top. As illustrated in FIG. 2, the exhaust pipe 231 is installed at a lower level than the locations where the gas supply holes 410a to 430a are installed, when seen from the side. Therefore, the gases supplied to around the wafers 200 in the process chamber 201 through the gas supply holes 410a to 430a flow in the horizontal direction, that is, the direction parallel to the surface of the wafer 200, and then flow downward to be exhausted through the exhaust pipe 231. The main flow direction of the gases in the process chamber 201 is the horizontal direction as described above.

From the upstream side toward the downstream side of the exhaust pipe 231, a pressure sensor 245, an APC (Automatic Pressure Controller) valve 243 and a vacuum pump 246 are sequentially connected to the exhaust pipe 231. The pressure sensor 245 is a pressure detector for detecting an inner pressure of the process chamber 201, the APC valve 243 is an exhaust valve constituted by a pressure controller, and the vacuum pump 246 is a vacuum exhaust device. Furthermore, a trap device for trapping by-products or unreacted source gas contained in an exhaust gas or a detoxifying device for removing corrosive substances or toxic constituents contained in the exhaust gas may be connected to the exhaust pipe 231. An exhaust system, that is, an exhaust line is constituted mainly by the exhaust pipe 231, the APC valve 243 and the pressure sensor 245. The exhaust system may further include the vacuum pump 246. The exhaust system may further include the trap device or detoxifying device.

While the vacuum pump 246 is operated, the APC valve 243 may be opened/closed to vacuum-exhaust the inside of the process chamber 201 or stop vacuum-exhausting. Furthermore, while the vacuum pump 246 is operated, the opening degree of the APC valve 243 may be adjusted to adjust the inner pressure of the process chamber 201.

A temperature sensor 263 is installed as a temperature detector in the reaction tube 203. Based on temperature information detected by the temperature sensor 263, the amount of power supplied to the heater 207 may be adjusted such that the inside of the process chamber 201 has a desired temperature distribution. The temperature sensor 263 is L-shaped like the nozzles 410 to 430, and installed along the inner wall of the reaction tube 203.

FIG. 5 is a block diagram schematically illustrating a controller 121. As illustrated in FIG. 5, the controller 121 is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. The controller 121 is connected to an I/O device 122 such as a touch panel.

The memory device 121c is embodied by a flash memory, an HDD (Hard Disk Drive) and the like, for example. The memory device 121c readably stores a control program for controlling the operation of the substrate processing apparatus or a process recipe describing the sequence or condition of a substrate processing step described later. The process recipe includes steps of the substrate processing step described later, which are combined to acquire a predetermined result through the controller 121, and functions as a program. Hereafter, the process recipe or control program is collectively referred to as a program. In this specification, "program" may indicate only a program recipe, indicate only a control program, or indicate both of the program recipe and the control program. The RAM 121b functions as a work area in which a program or data read by the CPU 121a is temporarily stored.

The I/O port 121d is connected to the above-described components of the substrate processing apparatus 101, such as the MFCs 312 to 332 and 512 to 532, the valves 314 to 334, 514 to 534 and 614, the pressure sensor 245, the APC valve 243, the vacuum pump 246, the heater 207, the temperature sensor 263, the boat rotating mechanism 267 and the boat elevator 115.

The CPU 121a reads a control program from the memory device 121c and executes the control program. Furthermore, the CPU 121a reads a process recipe from the memory device 121c in response to an input of operation command from the I/O device 122. The CPU 121a may control flow rate adjusting operations for various gases by the MFCs 312 to 332 and 512 to 532, opening/closing operations of the valves 314 to 334, 514 to 534 and 614, an opening/closing operation of the APC valve 243, a pressure control operation based on the pressure sensor 245 by the APC valve 243, a temperature adjusting operation of the heater 207 based on the temperature sensor 263, activation and suspension of the vacuum pump 246, a rotation and speed adjusting operation for the boat 217 by the boat rotating mechanism 267, and an elevating operation for the boat 217 by the boat elevator 115, according to the contents of the read process recipe.

The controller 121 is not limited to a dedicated computer, but may be embodied by a general purpose computer. For example, an external memory device 123 storing the above-described program may be prepared, and a program may be installed in a general purpose computer through the external memory device 123, in order to embody the controller 121 used in the first embodiment. The external memory device 123 may include a magnetic disk such as a magnetic tape, flexible disk and hard disk, an optical disk such as CD and DVD, a magneto-optical disk such as MO, and a semiconductor memory such as a USB memory and memory card. The unit for supplying a program to the computer is not limited to the configuration for supplying a program through the external memory device 123. For example, the program may be supplied through a communication unit such as the Internet and a dedicated line, without the external memory device 123. The memory device 121c and the external memory device 123 may be embodied by transitory computer readable recording media. Hereafter, they are collectively referred to as recording media. In this specification, "recording media" may indicate only the memory device 121c, indicate only the external memory device 123, or indicate both of the memory device 121c and the external memory device 123.

<Method of Manufacturing Semiconductor Device>

Next, a step of forming a metal film on a substrate when an LSI circuit is manufactured will be exemplified as one of processes of manufacturing a semiconductor device through the process furnace 202 of the above-described substrate processing apparatus 101. In the following descriptions, the components constituting the substrate processing apparatus 101 are controlled by the controller 121.

[First Embodiment]

In a first embodiment, a method of forming a tungsten film as the metal film on a substrate will be exemplified. The first embodiment includes four film forming steps of forming tungsten films on the substrate through different film forming methods. At a first film forming step, gases are alternately supplied to form a first tungsten film on the substrate. At a second film forming step, gases are supplied as a mixed atmosphere to form a second tungsten film on the first tungsten film. At a third film forming step, gases are alternately supplied to form a third tungsten film on the second tungsten film. At a fourth film forming step, gases are supplied as a mixed atmosphere to form a fourth tungsten film on the third tungsten film.

In the first embodiment, $WF_6$ may be used as a tungsten-containing source, $B_2H_6$ may be used as a first reactive gas, and $H_2$ may be used as a second reactive gas. Furthermore, the above-described first gas supply system serves as a tungsten-containing gas supply system (metal compound supply system), the above-described second gas supply system serves as a first reactive gas supply system, and the above-described third gas supply system serves as a second reactive gas supply system.

Figure 6A:
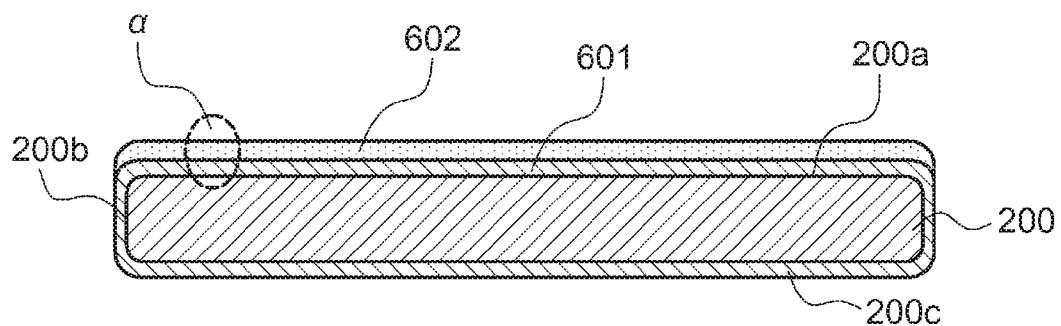
FIGS. 6A and 6B are diagrams illustrating a wafer on which a process according to the first embodiment described herein is performed.
Figure 6B:
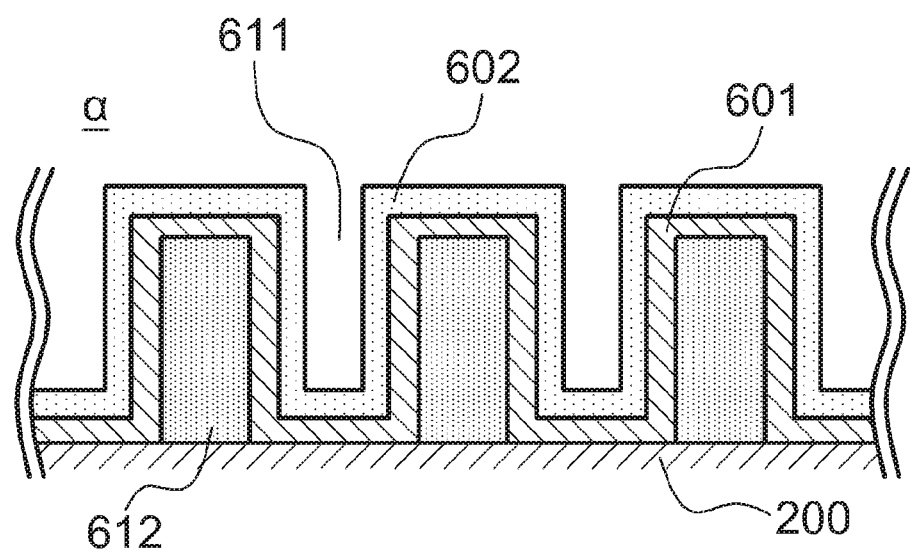
Figure 7A:
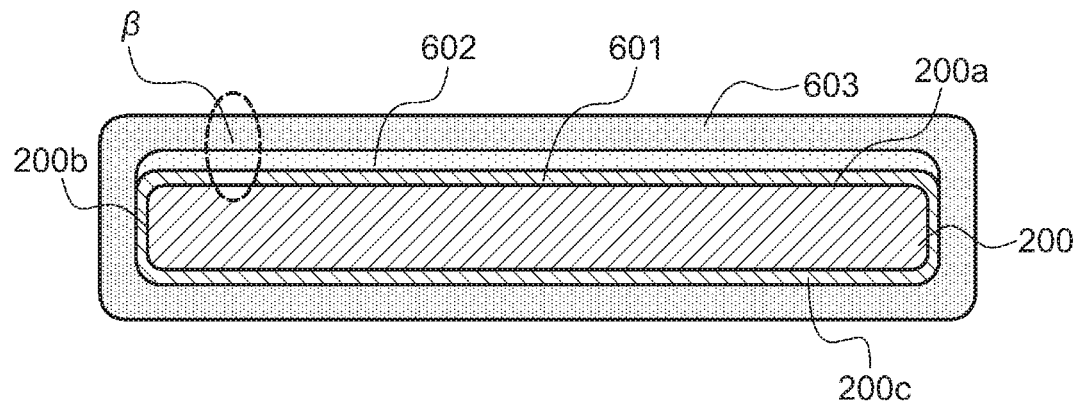
FIGS. 7A and 7B are diagrams illustrating a wafer on which a process according to the first embodiment described herein is performed.
Figure 7B:
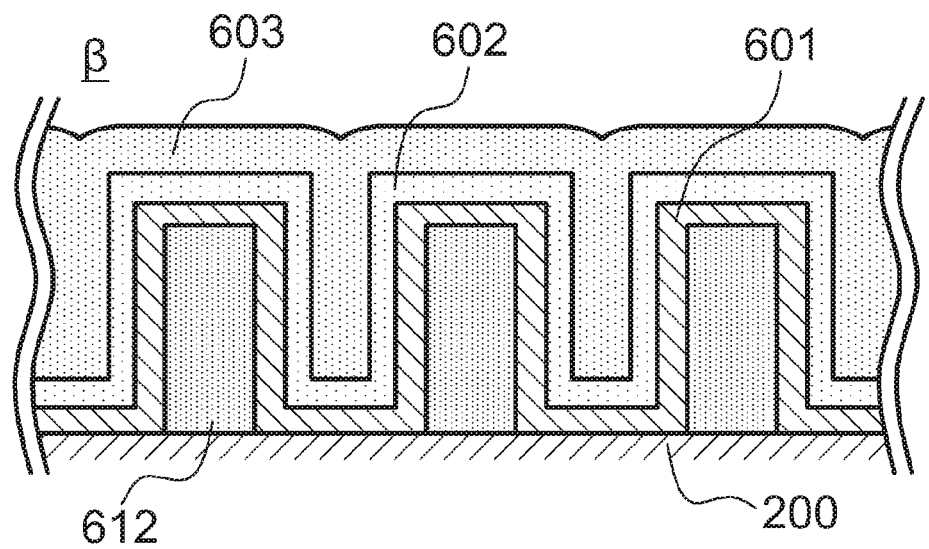

The substrate which is processed according to the first embodiment will be described with reference to FIGS. 6A and 6B and 7A and 7B. FIG. 6A is a diagram illustrating a wafer which is loaded into the substrate processing apparatus according to the first embodiment. The wafer 200 has a process surface (front surface) 200a, a side surface 200b and a rear surface 200c. FIG. 6B is an expanded view of a portion a indicated by a dotted line of FIG. 6A. FIG. 7A is a diagram illustrating the wafer that was subjected to the substrate processing method according to the first embodiment. FIG. 7B is an expanded view of a portion β indicated by a dotted line of FIG. 7A.

Referring to FIG. 6A, a silicon oxide film 601 is formed on the process surface (front surface) 200a, the side surface 200b and the rear surface 200c of the wafer 200 in advance. The silicon oxide film 601 is also referred to as a SiO film. The SiO film 601 is used as a charge storage layer, for example.

A nitride titanium film 602 is formed as a barrier metal layer on the SiO film 601 of the process surface 200a of the wafer 200. The nitride titanium film 602 is also referred to as a TiN film or first metal film. The TiN film 602 may be peeled off while physically coming in contact with the tweezer of the wafer transfer mechanism, when the substrate is transferred. Thus, the TiN film 602 is not formed on the side surface 200b and the rear surface 200c of the wafer 200. The TiN film 602 which had been formed on the side surface 200b and the rear surface 200c of the wafer 200 is removed through a process such as an etching process by a separate apparatus. As the side surface 200b and the rear surface 200c of the wafer 200 are not provided with the TiN film, the contamination of the transfer system is prevented. In the first embodiment, titanium is referred to as the first metal element.

FIG. 6B is an expanded view of the portion a indicated by a dotted line of FIG. 6A. In FIG. 6A, the SiO film 601 and the TiN film 602 are illustrated as planer films, for convenience of description. As illustrated in FIG. 6B, however, a plurality of ultra-fine grooves 611 are formed at the process surface 200a of the wafer 200. The SiO film 601 and the TiN film 602 are formed in the plurality of ultra-fine grooves 611.

Reference numeral 601 represents the silicon oxide film (SiO film), reference numeral 602 represents the TiN film, reference numeral 611 represents the ultra-fine groove, and reference numeral 612 represents a victim film defining a groove. The SiO film 601 and the TiN film 602 are formed in the grooves 611. As illustrated in FIG. 7B, the first embodiment has a structure for forming a tungsten film 603 in the grooves 611.

According to the first embodiment, substrate processing is performed while the wafer 200 is supported by the groove 212a of the boat 217. In this case, the side surface 200b or the rear surface 200c of the wafer 200 may be exposed to a gas, and the tungsten film 603 may be formed on the side surface 200b or the rear surface 200c of the wafer 200. As described above, the TiN film 602 serving as a barrier metal layer is not formed on the side surface 200b and the rear surface 200c of the wafer 200. Thus, when the tungsten film 603 is formed on the side surface 200b or the rear surface 200c of the wafer 200, the tungsten film 603 is directly formed on the SiO film 601 of the side surface 200b or the rear surface 200c of the wafer 200 as illustrated in FIG. 7A. Therefore, the tungsten film 603 of the side surface 200b or the rear surface 200c of the wafer 200 may be peeled off by stress which is generated when the wafer 200 is heated.

In the above-described example, the wafer 200 is supported by the boat 217. However, even when the wafer is supported by a substrate support as in a sing-wafer type substrate processing apparatus, the tungsten film may be directly formed on the SiO film of the side surface of the wafer.

The first embodiment for improving the above-described problem can suppress a peel-off of the film adhering to the side surface 200b or the rear surface 200c on which the barrier metal layer 602 of the wafer 200 is not formed, and form a low-resistance film.

Figure 8:
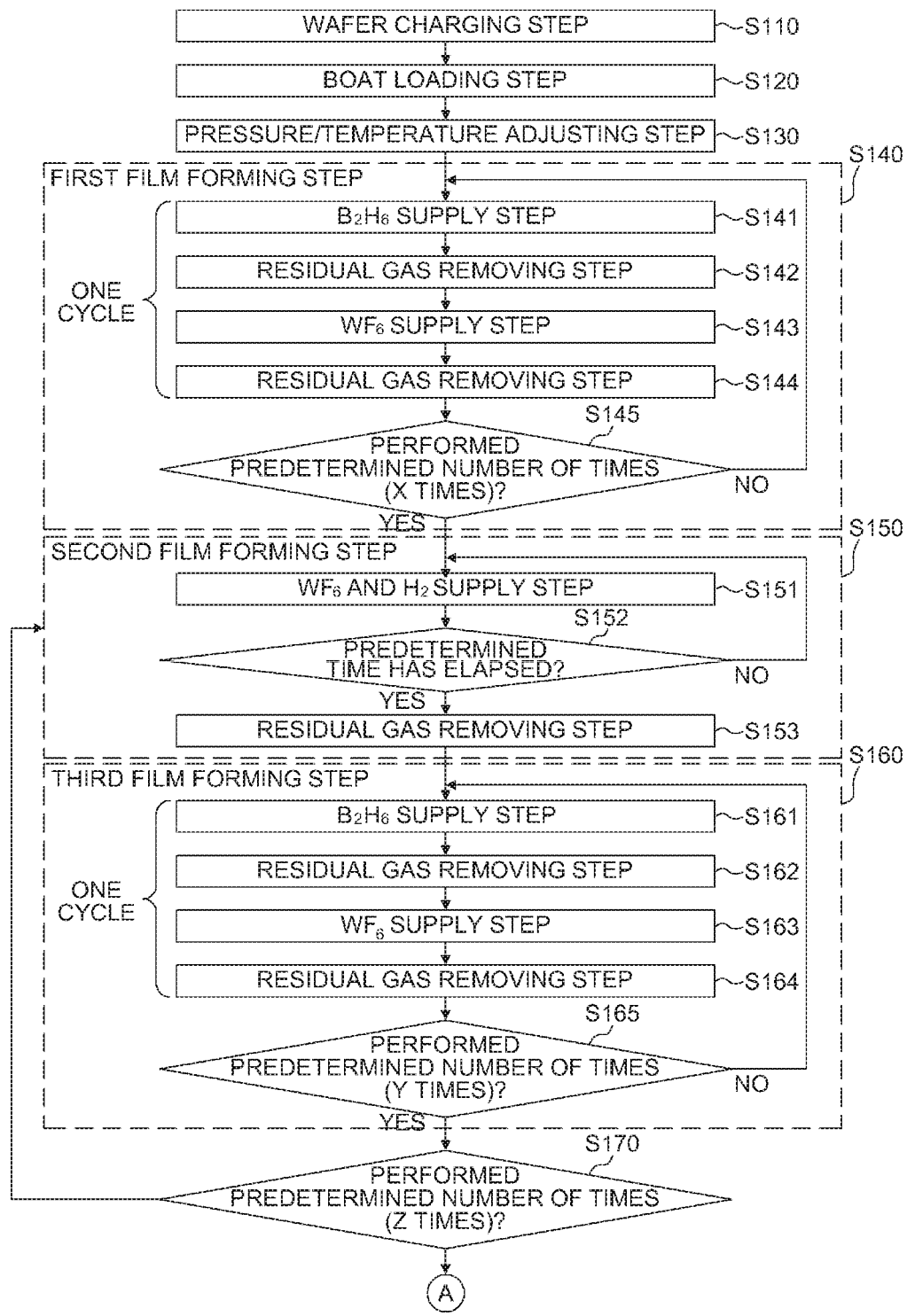
FIG. 8 is a diagram showing a control flow according to the first embodiment described herein.
Figure 9:
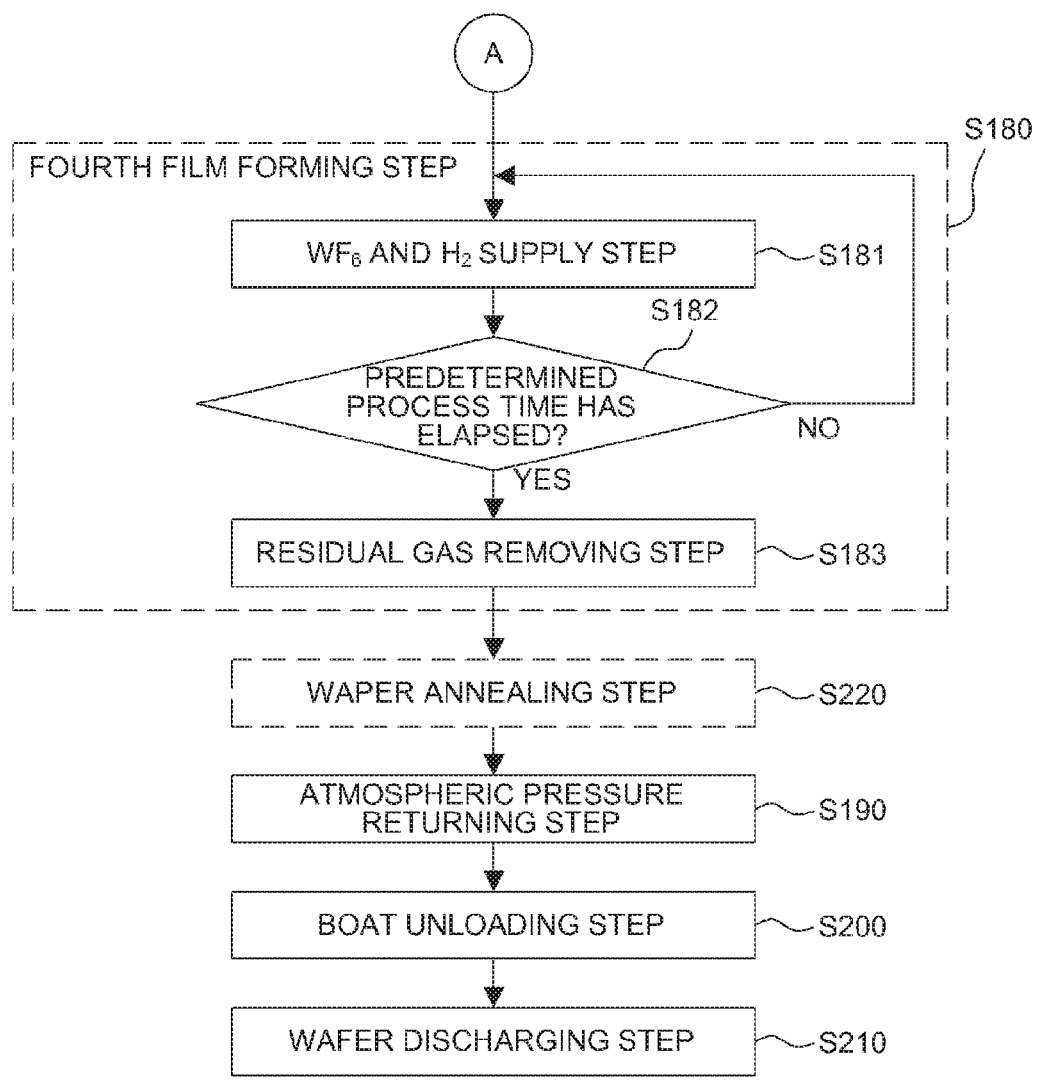
FIG. 9 is a diagram showing a control flow according to the first embodiment described herein.

Referring to FIGS. 8 and 9, a flow according to the first embodiment will be described. FIG. 9 shows steps which are consecutively performed at the final step of FIG. 8. That is, FIG. 9 shows steps which are performed when a determination result of step S170 in FIG. 8 is Yes.

(Wafer Charging Step S110)

First, the boat 217 is charged with a plurality of wafers 200 (wafer charging).

(Boat Loading Step S120)

The boat 217 housing the plurality of wafers 200 therein is moved up by the boat elevator 115, and loaded into the process chamber 201 (boat loading). The seal cap 219 seals the opening of the lower end of the reaction tube 203 with an O-ring 220 interposed therebetween.

The transferred wafer 200 includes ultra-fine grooves 611. In the first embodiment, the tungsten film 603 is formed in the ultra-fine grooves 611. Since the tungsten film 603 is used as a floating gate electrode of a flash memory, for example, the tungsten film 603 is required to have low resistance and high density.

The silicon oxide film ($SiO_2$ film) 601 serving as a charge storage layer is formed in the ultra-fine grooves 611 formed on the process surface 200a of the wafer 200 serving as a substrate in advance, and the nitride titanium film (TiN film) 602 (first metal film) is formed as a barrier metal layer on the $SiO_2$ film 601. The $SiO_2$ film or the TiN film is formed by a separate substrate processing apparatus (not illustrated), before being processed by the substrate processing apparatus 101 used in the first embodiment. As the barrier metal layer, a nitride tantalum film (TaN film) may be used in place of the TiN film 602. When the barrier metal layer is used, the adhesion between the tungsten film and the $SiO_2$ film 601 which are formed according to the first embodiment may be increased.

(Pressure and Temperature Adjusting Step S130)

During the film forming process, the controller 121 controls the substrate processing apparatus 101 as follows. That is, the controller 121 controls the heater 207 to adjust the inner temperature of the process chamber 201 to a predetermined temperature. The inner temperature of the process chamber 201 may be set in the range of 180° C. to 550° C., preferably set to not more than 250° C., or more preferably set to 200° C. After the inner temperature of the process chamber 201 is adjusted, the boat 217 is charged with the plurality of wafers 200, and loaded into the process chamber 201. Then, the boat 217 is rotated by the boat rotating mechanism 267, thereby rotating the wafer 200. Then, by opening the APC valve 243 while operating the vacuum pump 246, the inner atmosphere of the process chamber 201 is vacuum-exhausted. When the temperature of the wafer 200 is stabilized after reaching 200° C., steps described later are sequentially performed while the inner temperature of the process chamber 201 is maintained at 450° C.

(1) First Film Forming Step S140

FIG. 10 illustrates a sequence for forming a first tungsten film at a first film forming step S140 according to the first embodiment. The first tungsten film is used a seed layer. In the first embodiment, tungsten is referred to as a second metal element. As described above, the TiN film 602 is referred to as the first metal film, and the first tungsten film formed at the first film forming step S140 is referred to as the second metal film.

(First Reactive Gas Supply Step S141)

At the step S141, $B_2H_6$ having a property of reducing fluorine is supplied. $B_2H_6$ is supplied into the gas supply pipe 320, and a carrier gas ($N_2$) is supplied to the carrier gas supply pipe 520. The valve 324 of the gas supply pipe 320, the valve 524 of the carrier gas supply pipe 520 and the APC valve 243 of the exhaust pipe 231 are all opened. The carrier gas is supplied through the carrier gas supply pipe 520, and the flow rate of the carrier gas is adjusted by the MFC 522. $B_2H_6$ is supplied through the gas supply pipe 320, and the flow rate thereof is adjusted by the MFC 322. $B_2H_6$ with the adjusted flow rate is mixed with the carrier gas with the adjusted flow rate, supplied into the process chamber 201 through the gas supply holes 420a of the nozzle 420, and exhausted through the exhaust pipe 231. When $B_2H_6$ is supplied, the APC valve 243 is properly controlled to maintain the inner pressure of the process chamber 201 to a predetermined pressure. The inner pressure of the process chamber 201 may be set in the range of from 50 Pa to 1,000 Pa, and maintained at 60 Pa, for example. The flow rate of supplied $B_2H_6$ is controlled by the MFC 322. The flow rate of supplied $B_2H_6$ may range from 1 slm to 20 slm, for example. The time duration during which the wafer 200 is exposed to $B_2H_6$ may range from 10 seconds to 60 seconds. At this time, the temperature of the heater 207 is set to a predetermined temperature. The temperature of the heater 207 may range from 180° C. to 550° C. For example, the temperature of the heater 207 may be set to 200° C.

When an inert gas is supplied through the carrier gas supply pipe 510 connected to the gas supply pipe 310 by opening the valve 514 at the same time as the process of the above-described step S141, $B_2H_6$ can be prevented from permeating into the tungsten-containing gas supply system.

(Residual Gas Removing Step S142)

At the step S142, the valve 324 of the gas supply pipe 320 is closed to stop the supply of $B_2H_6$. With the APC valve 243 of the exhaust pipe 231 opened, the process chamber 201 is exhausted by the vacuum pump 246 such that the pressure of the process chamber 201 is equal to or less than 20 Pa. Then, $B_2H_6$ remaining in the process chamber 201 is removed from the process chamber 201. At this time, when an inert gas such as $N_2$ is supplied to the process chamber 201 through the gas supply pipe 320 serving as a $B_2H_6$ supply line and the gas supply pipe 310 serving as a $WF_6$ supply line in order to purge the process chamber 201, the remaining $B_2H_6$ can be removed more efficiently.

(Metal Compound Supply Step S143)

At the step S143, $WF_6$ is supplied. Specifically, $WF_6$ is supplied to the gas supply pipe 310, and a carrier gas ($N_2$) is supplied to the carrier gas supply pipe 510. The valve 314 of the gas supply pipe 310, the valve 514 of the carrier gas supply pipe 510 and the APC valve 243 of the exhaust pipe 231 are all opened. The carrier gas is supplied through the carrier gas supply pipe 510, and the flow rate thereof is adjusted by the MFC 512. $WF_6$ is supplied through the gas supply pipe 310, and the flow rate thereof is adjusted by the MFC 312. $WF_6$ with the adjusted flow rate is mixed with the carrier gas with the adjusted flow rate, supplied into the process chamber 201 through the gas supply holes 410a of the nozzle 410, and exhausted through the exhaust pipe 231. When $WF_6$ is supplied, the APC valve 243 is properly adjusted to such an extent that the inner pressure of the process chamber 201 is maintained at a predetermined pressure. The inner pressure of the process chamber 201 may range from 20 Pa to 50 Pa. For example, the inner pressure of the process chamber 201 is maintained at 30 Pa. The amount of $WF_6$ controlled by the MFC 312 may range from 0.1 g/min to 1.0 g/min. The time duration during which the wafer 200 is exposed to $WF_6$ may range from 3 seconds to 30 seconds. At this time, the temperature of the heater 207 is controlled to set the temperature of the wafer 200 to a predetermined temperature. The temperature of the heater 200 may range from 180° C. to 400° C. For example, the temperature of the heater 200 may be set to 200° C.

At the step S143, only $WF_6$ and the inert gas such as $N_2$ and Ar are supplied into the process chamber 201, but $B_2H_6$ is not supplied. Thus, $WF_6$ does not cause a vapor-phase reaction, and reacts with the surface of the wafer 200 or the base film (chemical adsorption), thereby forming an adsorption layer or tungsten layer of the source ($WF_6$). Hereafter, the tungsten layer is referred to as a tungsten-containing layer. The adsorption layer of $WF_6$ includes not only an adsorption layer in which source molecules are continuous, but also an adsorption layer in which source molecules are discontinuous. The tungsten-containing layer includes successive layers constituted by tungsten, but also a tungsten thin film formed while the layers are stacked. The successive layers constituted by tungsten are also referred to as a tungsten thin film.

When an inert gas is supplied through the carrier gas supply pipe 520 connected to the gas supply pipe 320 by opening the valve 524 at the same time as the process of the above-described step S143, $WF_6$ can be prevented from permeating into the first reactive gas supply system.

(Residual Gas Removing Step S144)

The valve 314 of the gas supply pipe 310 is closed to stop the supply of $WF_6$ to the process chamber 201, and the valve 614 is opened to supply $WF_6$ to a vent line. Thus, $WF_6$ can be stably supplied to the process chamber 201 at all times. With the APC valve 243 of the exhaust pipe 231 opened, the process chamber 201 is exhausted by the vacuum pump 246 until the inner pressure of the process chamber 201 is equal to or less than 20Pa. Then, $WF_6$ remaining in the process chamber 201 is removed from the process chamber 201. When an inert gas such as $N_2$ is supplied into the process chamber 201, the remaining $WF_6$ can be removed more efficiently.

By performing a cycle including the steps S141 to 144 one or more times, a tungsten film having a predetermined thickness is formed on the wafer 200. Specifically, fluorine (F) contained in the source (WF) formed on the surface of the substrate is reduced to a gas through a reaction with hydrogen (H) of the first reactive gas at the step S143, and the tungsten film is formed through the reduction. Boron (B) which is a residual component of the first reactive gas is remains in the tungsten film.

When the cycle is performed at least one or more times, the film needs to be formed while the film forming process is performed such that the atmosphere constituted by $B_2H_6$ at step S141 and the atmosphere constituted by $WF_6$ at step S143 are not mixed in the process chamber 201.

The thickness of the tungsten film formed by alternately supplying $WF_6$ and $B_2H_6$ may be adjusted to a range of 0.5 nm to 5 nm, for example, 0.5 nm by controlling the number of cycles. Thus, the resultant tungsten film includes successive films having a smooth surface and high density.

(Determination Step S145)

The determination step S145 includes determining whether a cycle including the steps S141 to S144 was performed a plurality of times (for example, X times). When the cycle was performed X times, a second film forming step S150 is performed. When the cycle was not performed X times, the cycle is repeated until the number of cycles reaches X.

(2) Second Film Forming Step S150

The second film forming step in which two kinds of gases are mixed to form a second tungsten film on the first tungsten film will be described. As described above, the TiN film 602, the first tungsten film and the second tungsten film are referred to as the first metal film, the second metal film and the third metal film, respectively.

(Metal Compound Gas and Second Reactive Gas Supply Step S151)

FIG. 11 is a diagram illustrating a sequence for forming a tungsten film of the second film forming step according to the first embodiment. At the second film forming step, the controller 121 controls the components such as the valves, the MFCs and the vacuum pump to supply $WF_6$ and $H_2$ into the process chamber 201, such that there occurs a timing at which a plurality of reactive gases simultaneously exist in the process chamber 201 and a tungsten film is deposited through a vapor-phase reaction. Hereafter, a specific film forming sequence will be described.

At the step S151, $WF_6$ and $H_2$ having a property of reducing fluorine are simultaneously supplied and mixed in the process chamber 201. Specifically, $WF_6$ is supplied to the gas supply pipe 310, and a carrier gas ($N_2$) is supplied to the carrier gas supply pipe 510. The valve 314 of the gas supply pipe 310, the valve 514 of the carrier gas supply pipe 510 and the APC valve 243 of the exhaust pipe 231 are all opened. The carrier gas is supplied through the carrier gas supply pipe 510, and the flow rate thereof is adjusted by the MFC 512. The $WF_6$ flows through the gas supply pipe 310 while the flow rate thereof is adjusted by the MFC 312, and is vaporized by a vaporizer (not illustrated). The vaporized WF$_6$ with the adjusted flow rate is mixed with the carrier gas with the adjusted flow rate, and supplied into the process chamber 201 through the gas supply holes 410a.

H$_2$ is supplied to the gas supply pipe 330, and the carrier gas (N$_2$) is supplied to the carrier gas supply pipe 530. The valve 334 of the gas supply pipe 330, the valve 534 of the carrier gas supply pipe 530 and the APC valve 243 of the exhaust pipe 231 are all opened. The carrier gas is supplied through the carrier gas supply pipe 520, and the flow rate thereof is adjusted by the MFC 522. H$_2$ is supplied through the gas supply pipe 330 while the flow rate thereof is adjusted by the MFC 332, mixed with the carrier gas with the adjusted flow rate, and supplied into the process chamber 201 through the gas supply holes 430a of the nozzle 430.

WF$_6$ and H$_2$ which are supplied into the process chamber 201 are exhausted through the exhaust pipe 231. The APC valve 243 is properly adjusted such that the inner pressure of the process chamber 201 is maintained at a predetermined pressure. The inner pressure of the process chamber 201 is maintained in the range of 10 Pa to 30 Pa, for example, at 20 Pa. The amount of supplied WF$_6$, controlled by the MFC 312, may range from 0.1 g/min to 1.0 g/min. The amount of supplied H$_2$, controlled by the MFC 322, may range from 1slm to 20 slm. The wafer 200 may be exposed to WF$_6$ and H$_2$ until the thickness of the film reaches a desired thickness. At this time, the temperature of the heater 207 is set to maintain the wafer 200 at a predetermined temperature. The temperature of the heater 200 may be set in the range of 100° C. to 550° C., for example, set to 200° C.

The temperature of the heater 207 at the step S151, that is, the temperature of the heater 207 at the second film forming step S150 may be set to substantially the same temperature as the temperature of the heater 207 at the first film forming step S140. At the step S151, the temperature of the heater 207 may be set to 200° C., for example. When the temperature of the heater 207 at the first film forming step S140 and the temperature of the heater 207 at the second film forming step S150 are set to substantially the same temperature, the process time can be shortened by an in-situ process, which makes it possible to increase the productivity of the semiconductor device.

Only WF$_6$, H$_2$ and the inert gas such as N$_2$ and Ar are supplied into the process chamber 201. Then, WF$_6$ and H$_2$ cause a vapor reaction to form the second metal film on the first metal film formed at the first film forming step S140.

As described above, a void or seam may be formed in an ultra-fine groove due to crystallization caused by a vapor-phase reaction which occurs in a CVD method. The reason that a void or seam is formed is considered to be because of crystallization of a film. The inventor of this application found that the crystallization of a film depends on the thickness or temperature of the film. Thus, at the second film forming step S150 of the first embodiment, the supply of the gases is stopped before the thickness of the tungsten film reaches a thickness at which the tungsten film is crystallized. That is, an amorphous film is formed at the step S150.

Figure 12:
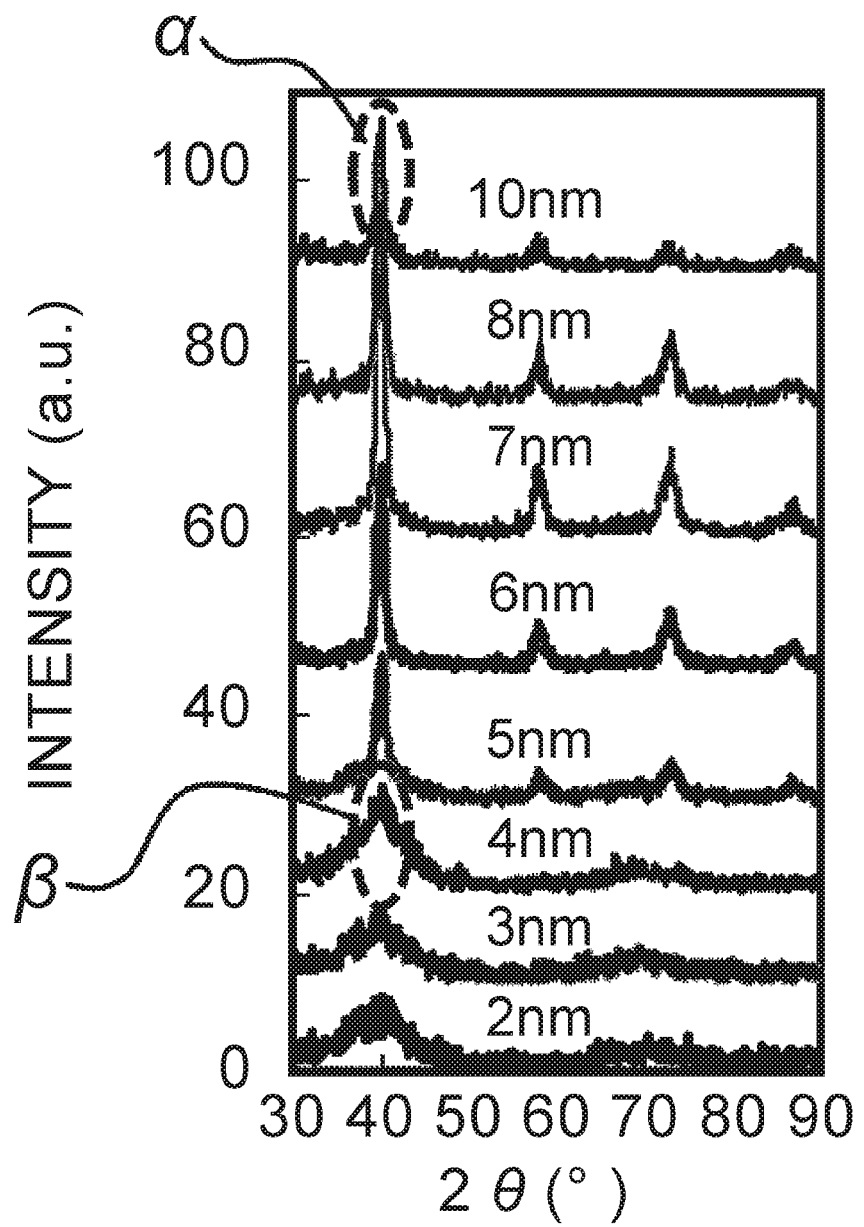
FIG. 12 is a graph illustrating a result obtained by analyzing the crystal structure of the tungsten film which is formed according to the first embodiment described herein.

FIG. 12 is a graph illustrating a result obtained by analyzing the crystalline structure of the tungsten film formed at the second film forming step through the X-ray analysis technique. In FIG. 12, the horizontal axis indicates an angle during measurement, and the vertical axis indicates intensity. In FIG. 12, values of "10 nm" to "2 nm" represent the thicknesses of the film. In the analysis result of FIG. 12, when the slope is as steep as indicated by "α", it indicates that the film is crystallized because the bond strength thereof is high, and when the slope is as gentle as indicated by "β", it indicates that the film is in an amorphous state.

Referring to FIG. 12, when the thickness of the film is equal to or less than 4 nm, the film is in an amorphous state. Thus, when the amorphous film is formed at the second film forming step, the thickness of the film may be set to a value larger than 0 nm and equal to or smaller than 4 nm.

In the first embodiment, the thickness of a film which is not crystallized may be set to a value larger than 0 nm and equal to or smaller than 4 nm, or preferably range from 3 nm to 4 nm.

(Determination Step S152)

The determination step S152 includes determining whether a predetermined process time has elapsed. When it is determined that the predetermined process time has elapsed, the valve 314 of the gas supply pipe 310 and the valve 324 of the gas supply pipe 320 are closed to stop the supply of WF$_6$ and H$_2$. At the step S152, "predetermined process time" is calculated from the film forming rate and the thickness at which the film is crystallized. More specifically, "predetermined process time" may indicate a process time during which the film is not crystallized. When the predetermined process time has not elapsed, the gases are continuously supplied to form the film.

At this time, with the APC valve 243 of the exhaust pipe 231 opened, the process chamber 201 is exhausted by the vacuum pump 246 until the inner pressure of the process chamber 201 is equal to or less than 20 Pa. Then, remaining WF$_6$ and H$_2$ are removed from the process chamber 201. At this time, when the valve 514 of the gas supply pipe 510 and the valve 524 of the gas supply pipe 520 are opened to supply an inert gas into the process chamber 201, remaining WF$_6$ and H$_2$ can be removed more efficiently.

(Residual Gas Removing Step S153)

After the film forming step of forming the amorphous tungsten film having a thickness at which the film is not crystallized, the inside of the process chamber 201 is purged by an inert gas such as N$_2$ gas, while the inert gas is supplied into the process chamber 201 and exhausted (gas purge).

(3) Third Film Forming Step S160

The third film forming step in which two kinds of gases are mixed to form the third tungsten film on the second tungsten film will be described. As described above, the TiN film 602, the first tungsten film, the second tungsten film and the third tungsten film are referred to as the first metal film, the second metal film, the third metal film and the fourth metal film, respectively.

The third film forming step S160 is performed in substantially the same manner as the first film forming step S140. However, the number of cycles, which is determined at a determination step S165, is different from that of the determination step S145. Specifically, the steps S141 to S144 are performed in substantially the same manner as steps S161 to S164. The step S145 and the step S165 are performed in substantially the same manner, except that the cycle is performed different numbers of times.

Hereafter, the third film forming step S160 will be described. Since the steps S161 to S164 are performed in substantially the same manner as the steps S141 to S144 of the first film forming step S140, the descriptions thereof are omitted herein.

(Determination step S165)

The determination step S165 includes determining whether a cycle including the steps S161 to S164 was performed a plurality of times (for example, Y times). When the cycle was performed Y times, the procedure proceeds to a determination step S170. When the cycle was not performed Y times, the cycle is repeated until the number of cycles reaches Y.

When the cycle is performed, the film needs to be formed while the film forming process is performed such that the atmosphere constituted by $B_2H_6$ at the step S161 and the atmosphere constituted by $WF_6$ at the step S163 are not mixed in the process chamber 201.

At the third film forming step S160, the crystallized tungsten film is formed on the amorphous tungsten film formed at the second film forming step S150. The amorphous tungsten film formed at the second film forming step S150 maintains an amorphous state.

When $B_2H_6$ is used as the first reactive gas as described above, decomposed boron remains in a film formed through one cycle. Thus, the higher the number of cycles (Y times), the higher the density of boron. Since the resistance value rises as the density of boron is high, the film cannot be used as an electrode such as a control electrode. Thus, a film which has a low resistance value because the film contains a small amount of boron may be preferably formed. In the first embodiment, the density of boron may be reduced by lowering the number of cycles (Y times).

Since the tungsten film formed at the third film forming step S160 needs to have a low resistance value and the amorphous tungsten film formed at the second film forming step S150 needs to maintain an amorphous state, the number (Y) of cycles may be set to 1 in order to adjust the film thickness to approximately 3□, at step S165.

(Determination Step S170)

The determination step S170 includes determining whether a cycle including the second and third film forming steps S150 and S160 was performed a predetermined number of times (for example, Z times). When the cycle was performed Z times, the fourth film forming step S180 is performed. When the cycle was not performed Z times, the cycle is repeated until the number of cycles reaches Z. In this way, the amorphous tungsten film having a desired film thickness is formed.

(4) Fourth Film Forming Step S180

The fourth film forming step in which two kinds of gases are mixed to form the fourth tungsten film on the third tungsten film will be described. The fourth tungsten film is formed at the uppermost part of the electrode. As described above, the TiN film 602, the first tungsten film, the second tungsten film, the third tungsten film and the fourth tungsten film are referred to as the first metal film, the second metal film, the third metal film, the fourth metal film and the fifth metal film, respectively.

(Metal Compound Gas and Second Reactive Gas Supply Step S181)

FIG. 11 is a diagram illustrating a sequence for forming the tungsten film of the fourth film forming step S180 according to the first embodiment. At the fourth film forming step S180, the controller 121 controls the components such as the valves, the MFCs and the vacuum pump to supply $WF_6$ and $H_2$ into the process chamber 201, such that there occurs a timing at which a plurality of reactive gases simultaneously exist in the process chamber 201 and a tungsten film is deposited through a vapor-phase reaction. Hereafter, a specific film forming sequence will be described.

At the step S181, $WF_6$ and $H_2$ are simultaneously supplied, and mixed in the process chamber 201. Specifically, $WF_6$ is supplied to the gas supply pipe 310, and a carrier gas ($N_2$) is supplied to the carrier gas supply pipe 510. The valve 314 of the gas supply pipe 310, the valve 514 of the carrier gas supply pipe 510 and the APC valve 243 of the exhaust gas pipe 231 are all opened. The carrier gas is supplied through the carrier gas supply pipe 510, and the flow rate thereof is adjusted by the MFC 512. $WF_6$ is supplied through the gas supply pipe 310 while the flow rate thereof is adjusted by the MFC 312, and vaporized by the vaporizer (not illustrated). The vaporized $WF_6$ with the adjusted flow rate is mixed with the carrier gas with the adjusted flow rate, and supplied into the process chamber 201 through the gas supply holes 410a of the nozzle 410.

$H_2$ is supplied to the gas supply pipe 330, and the carrier gas ($N_2$) is supplied to the carrier gas supply pipe 530. The valve 334 of the gas supply pipe 330, the valve 534 of the carrier gas supply pipe 530 and the APC valve 243 of the exhaust pipe 231 are all opened. The carrier gas is supplied through the carrier gas supply pipe 520, and the flow rate thereof is adjusted by the MFC 522. $H_2$ is supplied through the gas supply pipe 330 while the flow rate thereof is adjusted by the MFC 332, mixed with the carrier gas with the adjusted flow rate, and supplied into the process chamber 201 through the gas supply holes 430a of the nozzle 430.

$WF_6$ and $H_2$ supplied into the process chamber 201 are exhausted through the exhaust pipe 231. The APC valve 243 is properly adjusted to maintain the inner pressure of the process chamber 201 at a predetermined pressure. The inner pressure of the process chamber 201 may be maintained in the range of 10 Pa to 30 Pa, for example, at 20 Pa. The amount of $WF_6$, controlled by the MFC 312, may range from 0.1 g/min to 1.0 g/min. The amount of supplied $H_2$, controlled by the MFC 322, may range from 1 slm to 0.5 slm. The wafer 200 may be exposed to $WF_6$ and $H_2$ until a desired film thickness is obtained. At this time, the temperature of the heater 207 is set to maintain the wafer 200 at a predetermined temperature. The temperature of the heater 200 may be set in the range of 100° C. to 550° C., for example, set to 200° C.

The temperature of the heater 207 at the step S181, that is, the temperature of the heater 207 at the fourth film forming step S180 may be set to substantially the same temperature as the temperature of the heater 207 at the first film forming step S140 and the temperature of the heater 207 at the second film forming step S150. The temperature of the heater 207 at the step S181 may be set to 200° C., for example. When the temperature of the heater 207 at the fourth film forming step S180 is set to substantially the same temperature as the temperature of the heater 207 of the first film forming step S140 and the temperature of the heater 207 of the second film forming step S150, the process time can be shortened through an in-situ process and the productivity of the semiconductor device can be improved.

Only $WF_6$, $H_2$ and the inert gas such as $N_2$ and Ar are supplied into the process chamber 201. Then, $WF_6$ and $H_2$ cause a vapor reaction to form the fifth metal film on the fourth metal film formed at the third film forming step S160.

As described above, a void or seam may be formed in an ultra-fine groove due to crystallization caused by a vapor-phase reaction which occurs in the CVD method. The reason that a void or seam is formed is considered to be because of crystallization of a film. The inventor of this application found that crystallization of a film depends on the thickness or temperature of the film. Thus, at the fourth film forming step S180 of the first embodiment, the supply of the gases is stopped before the thickness of the tungsten film reaches the thickness at which the tungsten film is crystallized. That is, an amorphous film is formed at the step S180. The film thickness at which crystallization does not occur may be set to a value larger than 0 nm and equal to or smaller than 4 nm. At the fourth film forming step S180, the film thickness may range from 3 nm to 4 nm.

(Determination Step S182)

The determination step S182 includes determining whether a predetermined process time has elapsed. When it is determined that the predetermined process time duration has elapsed, the valve 314 of the gas supply pipe 310 and the valve 324 of the gas supply pipe 320 are closed to stop the supply of $WF_6$ and $H_2$. At the step S182, "predetermined process time" is calculated from the film forming rate and the thickness at which a film is crystallized. More specifically, "predetermined process time" may indicate a process time during which a film is not crystallized. When the predetermined process time has not elapsed, the gases are continuously supplied to form the film.

At this time, with the APC valve 243 of the exhaust pipe 231 opened, the process chamber 201 is exhausted by the vacuum pump 246 until the inner pressure of the process chamber 201 is equal to or less than 20 Pa. Then, remaining $WF_6$ and $H_2$ are removed from the process chamber 201. At this time, when the valve 514 of the gas supply pipe 510 and the valve 524 of the gas supply pipe 520 are opened to supply an inert gas into the process chamber 201, remaining $WF_6$ and $H_2$ can be removed more efficiently.

"Predetermined process time" at the determination step S182 may be equal to "predetermined process time" at the determination step S152. However, "predetermined process time" at the determination step S182 may be set to any values as long as the film is not crystallized while a desired thickness is achieved. Thus, "predetermined process time" at the determination step S182 may be different from "predetermined process time" at the determination step S152.

(Residual Gas Removing Step S183)

After the process of forming the amorphous tungsten film having a thickness at which the film is not crystallized, the inside of the process chamber 201 is purged by an inert gas such as $N_2$ gas, while the inert gas is supplied into the process chamber 201 and exhausted (gas purge). After the residual gas is discharged, the substrate processing process by the fourth film forming step S180 is completed. Then, an atmospheric pressure returning step S190 is performed.

(Atmospheric Pressure Returning Step S190)

At the step S190, the inner atmosphere of the process chamber 201 is replaced with the inert gas (inert gas replacement), and the inner pressure of the process chamber 201 is returned to normal pressure (atmospheric pressure return).

(Boat Unloading Step S200)

Next, the lower end of the reaction tube 203 is opened while the seal cap 219 is moved down by the boat elevator 115, and the processed wafer 200 is unloaded to the outside of the reaction tube 203 through the lower end of the reaction tube 203 while being supported by the boat 217 (boat unloading).

(Wafer Discharging Step S210)

Then, the processed wafer 200 is discharged from the boat 217 (wafer discharging). In this way, one film forming process (batch process) is ended.

Next, the films which are formed at the first to fourth film forming steps S140 to S170 according to the first embodiment will be described with reference to FIGS. 8, 9 and 13A to 13F.

Figure 13A:
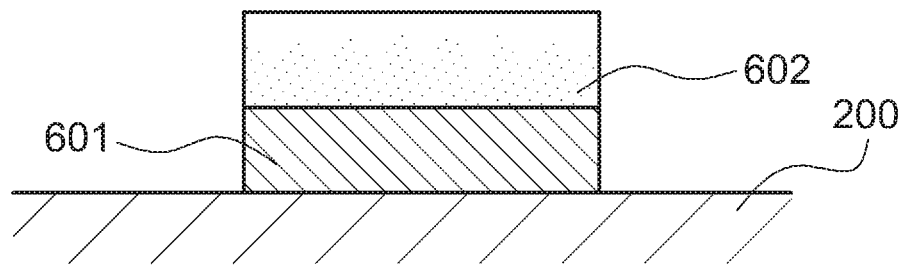

FIG. 13A is a diagram illustrating the wafer 200 which is loaded into the process chamber 100 in order to perform the first film forming step S140. For convenience of description, the ultra-fine grooves 611 and the victim film 612 therearound are not illustrated, and only the formed film is illustrated. The wafer 200 loaded into the process chamber 201 already has the silicon oxide film ($SiO_2$ film) 601 formed as a charge storage layer thereon, and the nitride oxide film (TiN film) 602 is formed as a barrier metal layer on the $SiO_2$ film 601. As the barrier metal layer, a tantalum nitride film (TaN film) may be used instead of the TiN film. The forming of the barrier metal layer can increase the adhesion between the $SiO_2$ film 601 and the tungsten-containing film formed by the first embodiment.

Figure 13B:
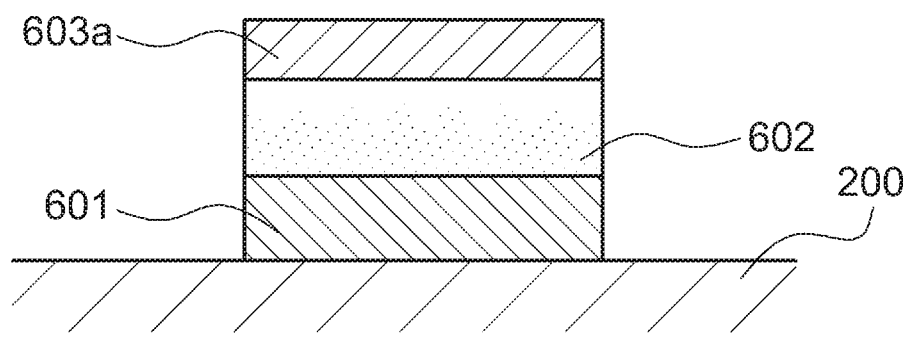

FIG. 13B is a diagram illustrating the wafer 200 obtained by subjecting the wafer 200 of FIG. 13A to the first film forming step S140 according to the first embodiment. At the first film forming step S140, the seed layer 603a serving as the second metal film is formed. The seed layer 603a formed at the first film forming step S140 has a smooth surface. Thus, the roughness of a film formed on the seed layer 603a at the next step can be suppressed.

Figure 13C:
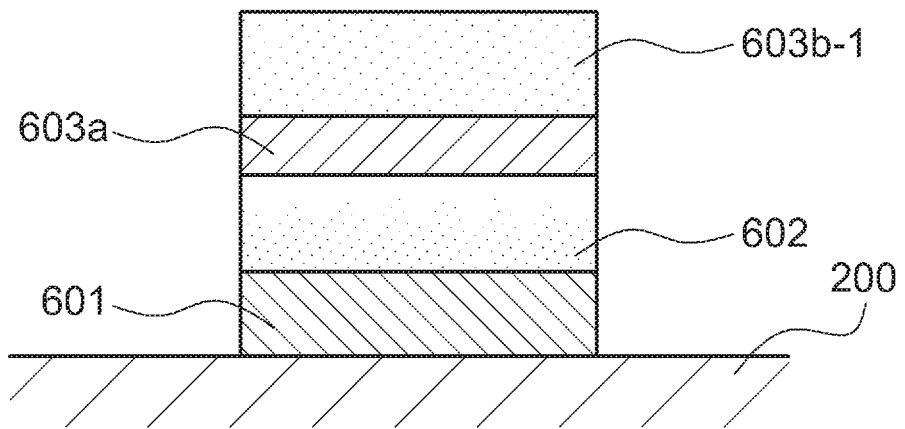

FIG. 13C is a diagram illustrating the wafer 200 obtained by subjecting the wafer 200 of FIG. 13B to the second film forming step S150 according to the first embodiment. An amorphous tungsten containing layer 603b-1 serving as the third metal film is formed on the seed layer 603a. Since the amorphous layer 603b-1 does not contain residue (boron in the first embodiment) which is caused when the gases are alternately supplied at the first and third film forming steps S140 and S160, the amorphous layer 603b-1 has low resistance. The amorphous layer 603b-1 which is not crystallized is deposited on the seed layer 603a without a void or seam being formed. In order to obtain the amorphous layer 603b-1 having low resistivity, the amorphous layer 603b-1 may have a larger thickness than a thin film tungsten-containing layer 603c described layer, within such a range that the amorphous layer 603b-1 is not crystallized. Thus, the film forming rate may be higher than when a film is formed only by the process of alternately supplying gases, and a low-resistance film may be formed.

Figure 13D:
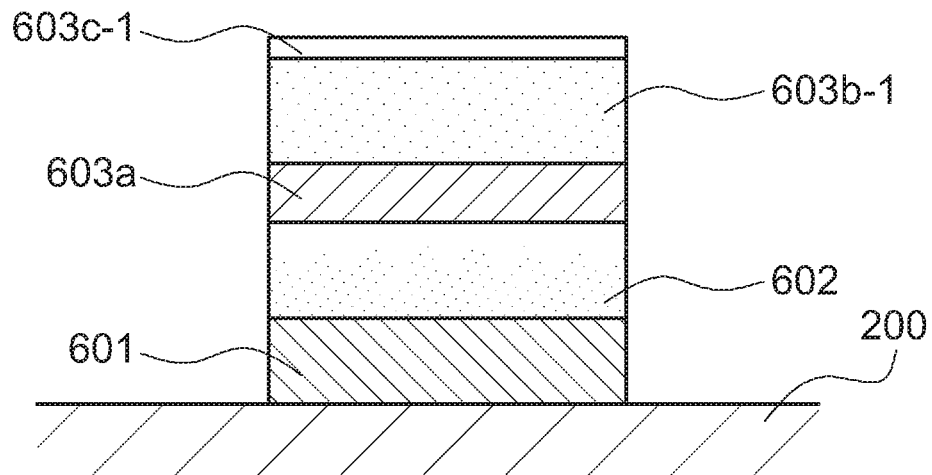

FIG. 13D is a diagram illustrating the wafer 200 obtained by subjecting the wafer 200 of FIG. 13 to the third film forming step S160 according to the first embodiment. A tungsten containing layer 603c-1 serving as the fourth metal film is formed on the amorphous layer 603b-1. At this time, boron components taken into the tungsten-containing layer 603c-1 migrate into the amorphous layer 603b-1 thereunder, and suppress crystallization of the amorphous layer. Since the tungsten-containing layer 603c-1 is positioned between the amorphous layer 603b-1 and the amorphous layer 603b-2 formed on the tungsten-containing layer 603c-1 through the second film forming step S150, the tungsten-containing layer 603c-1 can suppress crystallization of the amorphous layer 603b-1 when the amorphous layer 603b-2 is formed. In the first embodiment, boron components will be hereafter referred to as impurities.

Figure 13E:
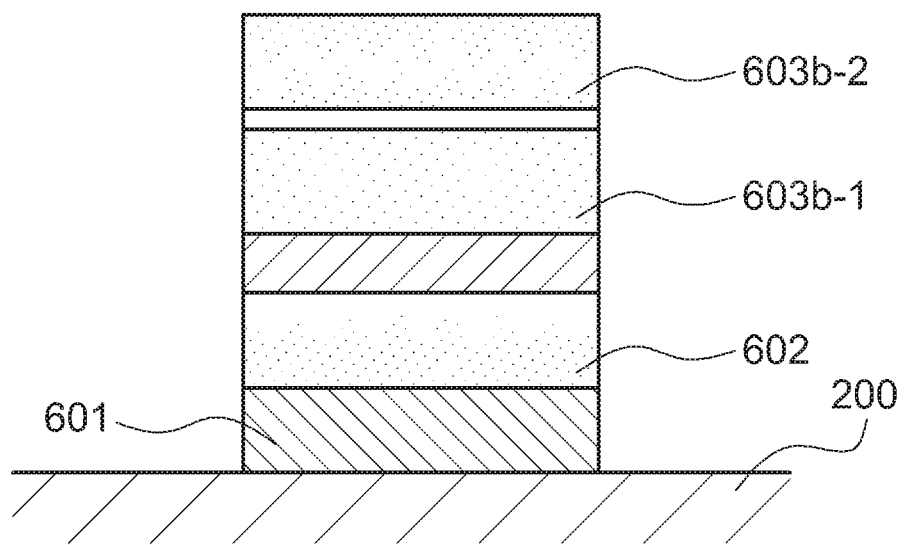

FIG. 13E is a diagram illustrating the wafer 200 obtained by subjecting the wafer 200 of FIG. 13D to the second film forming step S150 according to the first embodiment. The amorphous layer 603b-2 serving as the third metal film is formed on the tungsten-containing layer 603c-1.

FIG. 13F is a diagram illustrating a resultant tungsten film formed by performing the fourth film forming step S180 after repeating the second and third film forming steps S150 and S160. Over the seed layer 603a, the amorphous layers 603b-1 to 603b-Z formed at the second film forming step S150 and the thin tungsten-containing layers 603c-1 to 603c-Z formed at the third film forming step S160 are alternately formed. After the first film forming step S140 for forming the seed layer 603a, the second and third film forming steps S150 and S160 are repeated Z times to form a tungsten film with a desired thickness.

The top layer 603d of the tungsten film is formed at the fourth film forming step S180. The tungsten-containing layer 603c is formed by alternately supplying gases a plurality of times, while using decomposed gases. Therefore, the tungsten-containing layer 603c has a maximum thickness of 3□. On the other hand, the amorphous layer 603b formed through a vapor-phase reaction has a thickness of 3 nm to 4 nm as described later. When the thin tungsten-containing layer is formed through the third film forming step S160, it takes a considerable time until the thickness of the top layer 603d of the tungsten film becomes several dozens of nm. Thus, when the thickness of the top layer 603d of the tungsten film is adjusted, the amorphous film is formed through the fourth film forming step S180. Then, a low-resistance film with a desired thickness can be efficiently formed.

When the tungsten film is formed through the above-described method, the tungsten film is constituted mainly by amorphous films, and thus has low stress. That is, although though a film is formed on the side surface 200a or the rear surface 200c of the wafer 200 as illustrated in FIG. 7A, the tungsten film which is not peeled off can be formed.

(Annealing Step S220)

The tungsten film formed through the above-described method may be annealed (heated) in a nitrogen atmosphere at an annealing step S220 indicated by a dotted line in FIG. 9. The annealing treatment may be performed in the process chamber 201 after the fourth film forming step S180. Furthermore, the annealing treatment may not be performed in the substrate processing apparatus 101, but performed after the wafer 200 is transferred to another annealing apparatus. Hereafter, a method of performing an annealing treatment in the process chamber 201 after the tungsten film is formed will be described.

After the first to fourth film forming steps S140 to S180 are performed, the annealing step S220 is performed before the atmospheric pressure returning step S190. After the residual gas removing step S183, $N_2$ gas used as the carrier gas is supplied into the process chamber 201 through the nozzles of the respective gas supply systems, such that the inner atmosphere of the process chamber 201 is replaced with a nitrogen atmosphere. Simultaneously, the heater 207 is controlled until the temperature of the wafer 200 reaches 600° C., and the annealing treatment for the wafer is performed.

FIG. 14 is a graph illustrating a result obtained by analyzing the crystal structure of the tungsten film through the X-ray analysis technique. In FIG. 14, "A" represents a result obtained by analyzing the tungsten film formed through the first to fourth film forming steps S140 to S180, and "B" represents a result obtained by analyzing the tungsten film which is formed through the first to fourth film forming steps S140 to 180 and annealed at 600° C. In FIG. 14, the horizontal axis indicates an angle during measurement, and the vertical axis indicates intensity. In FIG. 14, a steep slope as represented by α indicates that the bond strength of the tungsten film is high. Since a has a steeper slope than β, the tungsten film of "B" may be considered to be crystallized unlike the tungsten film of "A". That is, the tungsten film may be crystallized through the annealing treatment.

(Description of Comparative Example)

Next, a comparative example will be described. In the comparative example, a tungsten film is formed by the same substrate processing apparatus as the first embodiment. However, a different substrate processing method and a different control method for the substrate process apparatus are applied.

In the following descriptions, since a wafer changing step, a boat loading step, a pressure/temperature adjusting step, an atmospheric pressure returning step, a boat unloading step and a wafer discharging step in the substrate processing method according to the comparative example are performed in the same manner as those of the first embodiment, the detailed descriptions thereof are omitted herein. The following descriptions will be focused on a difference from the substrate processing method of the first embodiment, that is, the film forming step.

(Substrate Processing Method of Comparative Example)
(Film Forming Step)

At the film forming step according to the comparative example, a tungsten film is formed in the grooves 611 in a state where the same substrate as the first embodiment is set to a process target.

When the inner pressure and temperature of the process chamber become desired values after the substrate is loaded, a cycle including a step of supplying $B_2H_6$ and a step of supplying $WF_6$ is performed a plurality of times. When the cycle is performed, fluorine (F) in a source (WF) formed on the surface of the substrate is reduced to a gas through a reaction with hydrogen (H) of the first reactive gas, thereby forming a tungsten film.

At the step of supplying $B_2H_6$, $B_2H_6$ is decomposed, and at the step of supplying $WF_6$, $WF_6$ is decomposed. The decomposed gases react at each cycle, thereby forming a dense film with a high degree of coupling.

(Comparison Between Comparative Example and First Embodiment)

The formed through the comparative example has the following problems, unlike the film formed through the first embodiment. First, the film formed through the comparative example has high resistance. According to the comparative example, the layer formed at each cycle contains boron, and layers are stacked until a desired film thickness is obtained. As a result, the resistance of the film rises. Thus, unlike the first embodiment, the film formed through the comparative example is not suitable for being used as an electrode. Therefore, when a film is used as an example, the film may be preferably formed through the substrate processing method according to the first embodiment.

Second, the film formed through the comparative example has high stress. The stress of the film will be described with reference to FIG. 15. FIG. 15 is a table showing the films formed through the first embodiment and the comparative example and the stresses of the films. In FIG. 15, "first W film" represents a tungsten film formed by performing the first to fourth film forming steps S140 and S180, "second W film" is a film obtained by annealing the first W film, and "W film of comparative example" is a tungsten film formed through the comparative example. FIG. 15 shows stress data measured for the respective films.

As shown in FIG. 15, the stress of the first W film is 1110.2 MPa, the stress of the second W film is 1122.9 MPa, and the stress of the W film of the comparative example is 1991.4 MPa, which indicates that the stress of the tungsten film of the comparative example is considerably higher than the stress of the tungsten films of the first embodiment. That is, the tungsten film of the comparative example is more easily peeled off by stress than the tungsten films of the first embodiment. On the other hand, the tungsten films of the first embodiment are hardly peeled off, because they have lower stress than the tungsten film of the comparative example.

In the first embodiment, $WF_6$ and $H_2$ are used when an amorphous film is formed. However, the technique described herein exemplified in the embodiment is not limited thereto. For example, $WF_6$ and $B_2H_6$ may be used when an amorphous film is formed.

In the first embodiment, the method of forming a floating gate electrode of a flash memory has been exemplified. However, the technique described herein is not limited thereto. The technique described herein may be applied even when a control electrode of a flash memory or a metallic wiring is formed.

In the first embodiment, a tungsten film is formed as the metal film, and a boron-containing tungsten film is formed as an ultra-thin film. However, the technique described herein is not limited thereto. The technique described herein may be applied even when a metal film containing at least one of a metal nitride film such as TiN film, TaN film, molybdenum nitride film (MoN film) and zinc nitride film (ZnN) film, a metal carbide film, a metal film containing at least one of Cu, Ru and Al and combinations thereof are formed. Furthermore, the technique described herein may be applied even when an amorphous thin metal film, a metal nitride film, a metal carbide film or combinations thereof are formed as the ultra-thin film.

The first embodiment may be more efficiently applied when a large-diameter wafer is processed. The reason is as follows. Recently, in order to improve the yield, a wafer having a larger diameter (for example, 450 nm) than an existing wafer (for example, a wafer having a diameter of 300 nm) has been used. The larger the size of the wafer, the larger the film forming area. When the film forming area is increased, the influence of thermal stress becomes prominent. Thus, the thermal stress is required to be reduced. Specifically, the thermal stress is required to be reduced at the process surface of a wafer having a barrier film formed thereon as well as the thermal stress at the side surface or rear surface of the wafer.

Since the technique described herein can lower the stress of a film, the technique can suppress the film from being peeled off from a large-diameter wafer. Thus, the technique described herein is more efficient when the technique is applied to a large-diameter wafer. In the above description, a large-diameter has been described. However, the technique described here is not limited to the large-diameter wafer. The technique described herein may be efficiently applied even when a three-dimensional device structure with a large film forming area is formed.

According to the technique described herein, when a low-resistance film is formed, a peel-off of the film can be suppressed.

What is claimed is:

1. A method of manufacturing a semiconductor device, comprising:
    (a) loading a substrate into a process chamber, the substrate having: a process surface provided with a first metal film containing at least a first metal element; and surfaces without the first metal film;
    (b) forming a second metal film on the substrate loaded in the process chamber by alternately supplying a metal compound and a first reactive gas reactive with the metal compound to the substrate a plurality of times, wherein the metal compound contains at least a second metal element different from the first metal element;
    (c) alternately performing steps (c-1) and (c-2) a plurality of times wherein the step (c-1) comprises: forming an amorphous third metal film on the second metal film by supplying the metal compound mixed with a second reactive gas reactive with the metal compound to the substrate, and the step (c-2) comprises: forming a fourth metal film on the third metal film by alternately supplying the metal compound and the first reactive gas to the substrate at least once; and
    (d) forming an amorphous fifth metal film on the fourth metal film by supplying the metal compound mixed with the second reactive gas to the substrate.

2. The method of claim 1, wherein the first reactive gas is different from the second reactive gas, and each of the first reactive gas and the second reactive gas comprises at least a reducing gas.

3. The method of claim 1, wherein the metal compound comprises at least fluorine, and each of the first reactive gas and the second reactive gas comprises at least a reducing gas capable of reducing fluorine.

4. The method of claim 1, further comprising: (e) heating the substrate after performing the step (d).

5. The method of claim 1, wherein the fourth metal film formed in the step (c-2) is thinner than the third metal film.

6. The method of claim 1, wherein the first metal element comprises titanium, and the second metal element comprises tungsten.

* * * * *